United States Patent [19]
Setogawa

[11] Patent Number: 6,055,210
[45] Date of Patent: Apr. 25, 2000

[54] SYNCHRONOUS TYPE SEMICONDUCTOR MEMORY DEVICE

[75] Inventor: Jun Setogawa, Hyogo, Japan

[73] Assignee: Mitsubishi Denki Kabushiki Kaisha, Tokyo, Japan

[21] Appl. No.: 09/245,085

[22] Filed: Feb. 5, 1999

[30] Foreign Application Priority Data

Sep. 28, 1998 [JP] Japan .................... 10-273312

[51] Int. Cl.[7] .................................. G11C 8/00
[52] U.S. Cl. .............. 365/233; 365/189.04; 365/189.07; 365/194
[58] Field of Search ................... 365/233, 194, 365/239, 189.05, 189.03, 205, 189.04, 189.07

[56] References Cited

U.S. PATENT DOCUMENTS

| | | | |
|---|---|---|---|
| 5,740,123 | 4/1998 | Uchida | 365/233 |
| 5,764,584 | 6/1998 | Fukiage et al. | 365/230.03 |
| 5,768,177 | 6/1998 | Sakuragi | 365/194 |
| 5,903,514 | 5/1999 | Sawada | 365/233 |

FOREIGN PATENT DOCUMENTS

| | | |
|---|---|---|
| 6-076566 | 3/1994 | Japan . |
| 9-304484 | 11/1997 | Japan . |

*Primary Examiner*—David Nelms
*Assistant Examiner*—Thong Le
*Attorney, Agent, or Firm*—McDermott, Will & Emery

[57] ABSTRACT

When the frequency of an external clock signal is higher than a prescribed frequency in an SDRAM, an output signal from a clock frequency detection circuit is at an L level, a transfer control signal is fixed to an H level, and first and second data buses are coupled together. Thus, a malfunction when the transfer control signal attains an H level in a pulse manner while read data is not output to the first data bus can be prevented. Accordingly, an SDRAM having a larger operating frequency range can be obtained.

11 Claims, 19 Drawing Sheets

FIG. 1
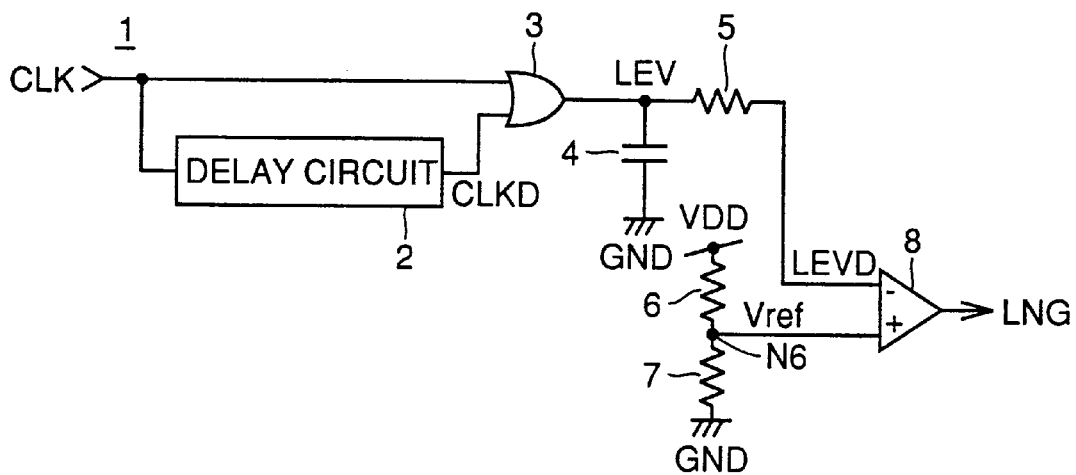
FIG. 2A CLK 
FIG. 2B CLKD 
FIG. 2C LEV 
TIME t →

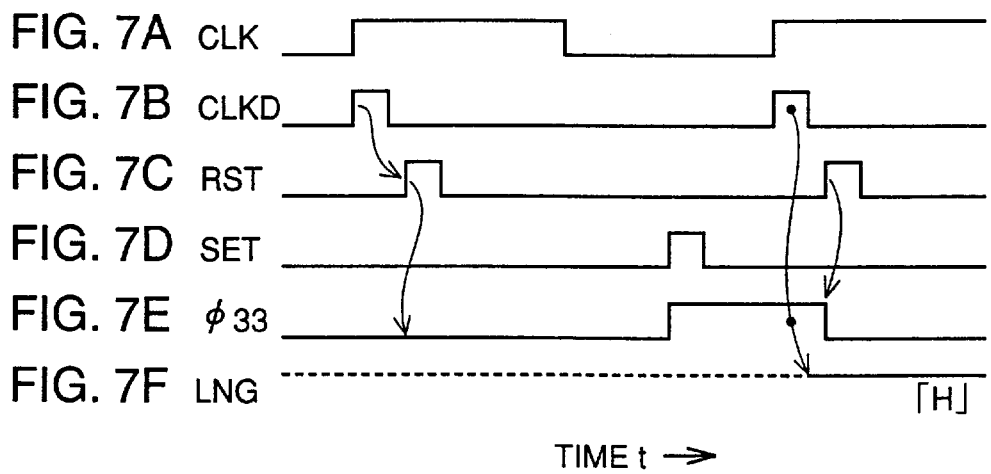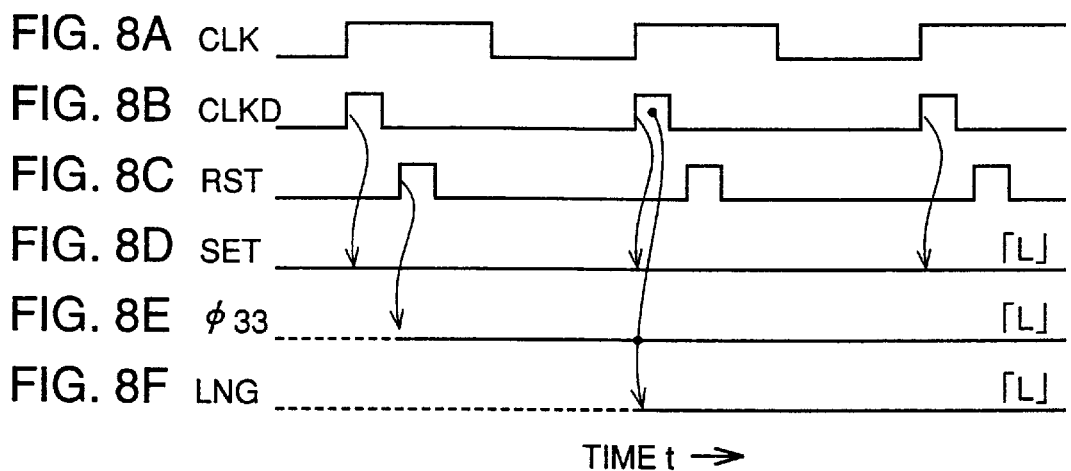

FIG. 10
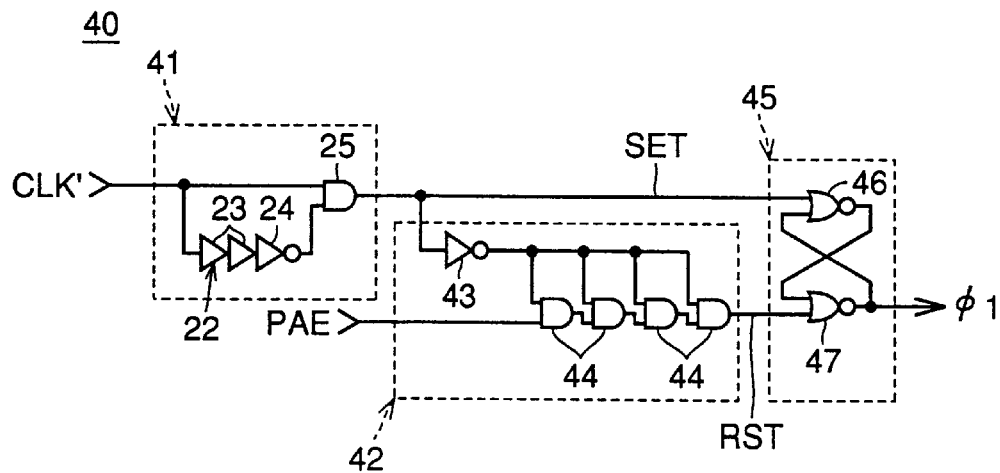
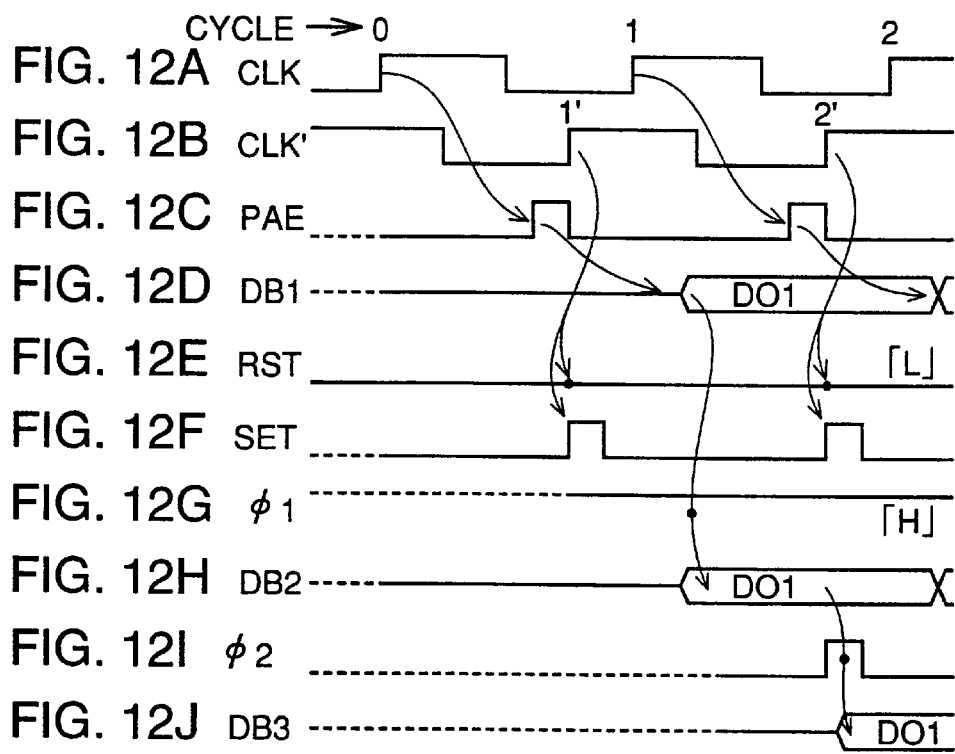

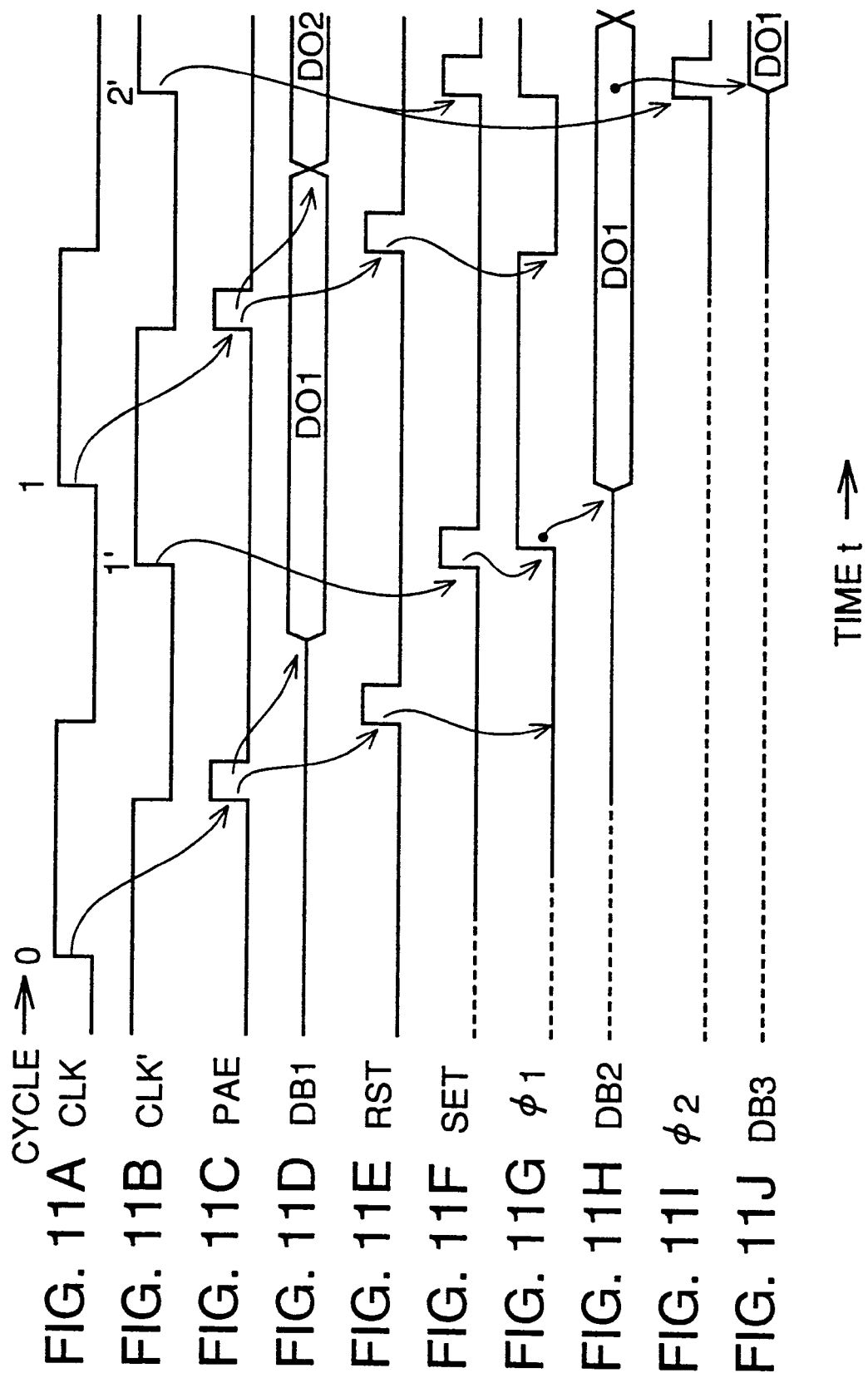

FIG. 14
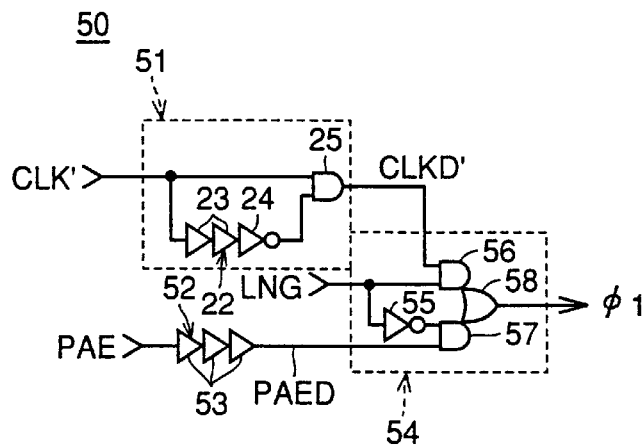
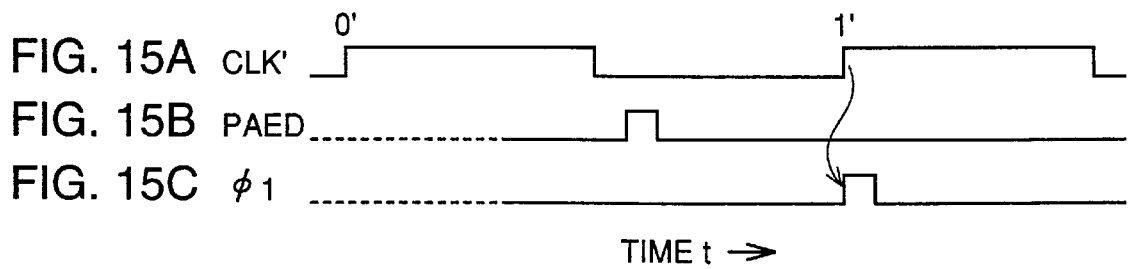
FIG. 15A CLK'
FIG. 15B PAED
FIG. 15C φ1
TIME t →
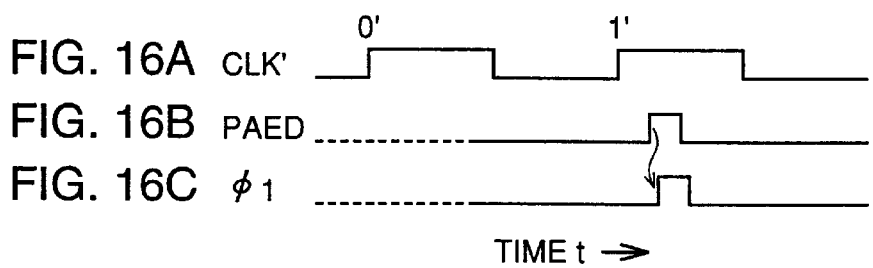
FIG. 16A CLK'
FIG. 16B PAED
FIG. 16C φ1
TIME t →

6,055,210

SYNCHRONOUS TYPE SEMICONDUCTOR MEMORY DEVICE

BACKGROUND OF THE INVENTION

1. Field of the Invention

The present invention relates to synchronous type semiconductor memory devices and more particularly to a synchronous type semiconductor memory device operating in synchronization with a clock signal.

2. Description of the Background Art

FIG. 22 is a block diagram showing the configuration of a conventional synchronous random access memory (hereinafter referred to as an SDRAM 70). Referring to FIG. 22, SDRAM 70 includes a clock buffer 71, a control signal input circuit 72, an address input circuit 73, a mode register 74, and a control circuit 75.

Clock buffer 71 is activated by a signal CKE and it transmits an external control signal CLK to control signal input circuit 72, address input circuit 73, and control circuit 75. Control signal input circuit 72 latches and supplies external control signals /CS, /RAS, /CAS, /WE, DQM to control circuit 75 in synchronization with external clock signal CLK from clock buffer 71. Address input circuit 73 latches and supplies external address signals A0 to Am (m is an integer of at least 0) and a bank selection signal BA to control circuit 75 in synchronization with external clock signal CLK from clock buffer 71. Mode register 74 stores modes designated by external address signals A0 to Am, for example. Control circuit 75 produces various internal signals in accordance with signals from clock buffer 71, input circuits 72, 73 and mode register 74, and controls the entire SDRAM 70.

SDRAM 70 includes a memory array 76a (bank #0), a memory array 76b (bank #1), row decoders 77a, 77b, column decoders 78a, 78b, sense amplifier+input/output control circuits 79a, 79b, a data transfer circuit 80, a data input/output circuit 81.

Memory array 76a is arranged in a matrix and it includes a plurality of memory cells each storing 1-bit data. Each memory cell is arranged at a prescribed address determined by row and column addresses.

Row decoder 77a designates row addresses of memory array 76a in response to row address signals RA0 to RAm supplied from control circuit 75. Column decoder 78a designates column addresses of memory array 76a in response to column address signals CA0 to CAm supplied from control circuit 75.

Sense amplifier+input/output control circuit 79a connects memory cells at addresses designated by row decoder 77a and column decoder 78a to one end of a data bus DB. Memory arrays 76a and 76b, row decoders 77a and 77b, column decoders 78a and 78b, sense amplifier+input/output control circuits 79a and 79b have respective same configurations.

The other end of data base DB is connected to data transfer circuit 80. ata transfer circuit 80 is controlled by control signals $\Phi1$, $\Phi2$, . . . supplied from control circuit 75 and it transfers data between data bus DB and data input/output circuit 81. Data input/output circuit 81 is controlled by control signals $\Phi3$, . . . supplied from control circuit 75, and it supplies externally input data through data transfer circuit 80 and data bus DB to a selected memory cell in a writing mode, and externally outputs read data that is read from a selected memory cell and supplied through data bus DB and data transfer circuit 80 in a reading mode.

FIG. 23 is a circuit block diagram showing a portion that is related to transfer and output of read data DO of SDRAM 70 shown in FIG. 22. Referring to FIG. 23, SDRAM 70 is provided with a DLL circuit 82, a memory control circuit 83, a transfer control circuit 84, a preamplifier 85, latch circuits LA1 to LA3, and an output buffer 86.

DLL circuit 82, memory control circuit 83 and transfer control circuit 84 is included in control circuit 75 in FIG. 22. DLL circuit 82 produces an internal clock signal CLK' in synchronization with external clock signal CLK externally supplied through clock buffer 71. Memory control circuit 83 produces a preamplifier activation signal PAE in synchronization with external clock signal CLK, and supplies signal PAE to preamplifier 85. Transfer control circuit 84 produces transfer control signal $\Phi1$ to $\Phi3$ in synchronization with internal clock signal CLK' produced in DLL circuit 82, and supplies signals $\Phi1$ to $\Phi3$ to latch circuits LA1 to LA3, respectively.

Preamplifier 85 is provided at the last stage of each of sense amplifier+input/output control circuits 79a, 79b in FIG. 22. Preamplifier 85 is activated by signal PAE supplied from memory control circuit 83, and preamplifier 85 amplifies data DO read from a memory cell and supplies the data to one end of a data bus DB1.

The other end of data bus DB1 is connected through a latch circuit LA1, a data bus DB2, a latch circuit LA2, a data bus DB3, a latch circuit LA3 and an output buffer 86 to a data input/output pin DQP. Latch circuits LA1, LA2 are included in data transfer circuit 80 in FIG. 22, and latch circuit LA3 and output buffer 86 are included in data input/output circuit 81 in FIG. 22.

Latch circuit LA1 includes clocked inverters 91, 92, and inverters 93, 94. Clocked inverter 91 and inverter 93 are connected in series between data buses DB1 and DB2, and clocked inverter 92 and inverter 93 are reversely connected in parallel. Transfer control circuit $\Phi1$ is directly input to the control node of clocked inverter 91 and input through inverter 94 to the control node of clocked inverter 92.

As shown in FIGS. 24A and 24B, clocked inverter 91 includes an input node 91a, an output node 91b, a control node 91c, P channel MOS transistors 95, 96, N channel MOS transistors 97, 98, and an inverter 99. P channel MOS transistors 95, 96 are connected in series between a power supply potential VDD line and output node 91b, and N channel MOS transistors 97, 98 are connected in series between output node 91b and a ground potential GND line. MOS transistors 96, 97 have their gates connected to input node 91a, and N channel MOS transistor 98 has its gate connected to control node 91c. Inverter 99 is connected between the gate of N channel MOS transistor 98 and the gate of P channel MOS transistor 95. When control node 91c attains an "H" level active state, MOS transistor 95, 98 are rendered conductive, and clocked inverter 91 operates as an inverter formed of MOS transistors 96, 97. This applies to clocked inverter 92.

Accordingly, in latch circuit LA1, while signal $\Phi1$ is at an H level, clocked inverter 91 is activated, clocked inverter 92 is inactivated, and data signal on data bus DB1 is transmitted through clocked inverter 91 and inverter 93 to data bus DB2. While signal $\Phi1$ is at an L level, clocked inverter 91 is inactivated, clocked inverter 92 is activated, data buses DB1 and DB2 are disconnected, and data signal on data bus DB2 is latched by inverter 93 and clocked inverter 92.

Latch circuits LA2, LA3 operate similarly to latch circuit LA1. While signal $\Phi2$ is at an H level, data signal on data bus DB2 is transmitted through latch circuit LA2 to data bus DB3. While signal Φ2 is at an L level, data buses DB2 and DB3 are disconnected, and data signal on data bus DB3 is latched by latch circuit LA2. While signal Φ3 is at an H level, data signal on data bus DB3 is transmitted through latch circuit LA3 to output buffer 86. While signal Φ3 is at an L level, data bus DB3 and output buffer 86 are disconnected, and an input signal of output buffer 86 is latched by latch circuit LA3.

Output buffer 86 externally outputs data signal that is supplied from latch circuit LA3 through data input/output pin DQP.

FIG. 25 is a time chart showing the operation of the circuits shown in FIGS. 23, 24A and 24B. Referring to FIG. 25, DLL circuit 82 produces internal clock signal CLK' of which rising/falling timing is made earlier by predetermined time at the same frequency as external clock signal CLK.

After reading time Tout from the rising edge of external clock signal CLK in a certain cycle 0, read data DO is output to data bus DB1. In response to the rising edge of internal clock signal CLK' in cycle 1' that corresponds to the rising edge of external clock signal CLK in cycle 1, transfer control signal Φ1 attains an H level in a pulse manner, and data DO on data bus DB1 is accordingly transmitted through latch circuit LA1 to data bus DB2.

Similarly, pulses of transfer control signals Φ2, Φ3 attain an H level in a pulse manner in response to the rising edges of internal clock signal CLK' in cycles 2', 3', and read data DO is output to input/output pin DQP after prescribed time since the rising edge of internal clock signal CLK' in cycle 3'. Users of SDRAM 70 receive data DQ at this timing.

In such SDRAM 70, the acceptable frequency range of external clock signal CLK is predetermined for each chip. If a user tries to shorten the reading time, however, external clock signal CLK at a frequency higher than the acceptable range may be used.

In this case, transfer control signal Φ1 attains an H level in a pulse manner before data DO is output to data bus DB1 as shown in FIG. 26. Thus, read data DO cannot properly be received to latch circuit LA1 and a malfunction is caused.

Even if the frequency of external clock signal CLK is within the acceptable range, read data DO cannot properly be received to latch circuit LA1 and a malfunction is caused when reading time Tout becomes longer because of the using condition and over-time change of a chip.

SUMMARY OF THE INVENTION

Accordingly, a main object of the present invention is to provide a synchronous type semiconductor memory device having a larger operating frequency range.

In one aspect of the present invention, a clock cycle detection circuit detects whether a clock cycle is shorter than a predetermined cycle and, when it is shorter, activates a transfer circuit regardless of an internal clock signal. Accordingly, even when the clock cycle is shorter than the predetermined cycle, the transfer circuit is not activated while data is not read and a malfunction is not caused unlike in the prior art. Thus, an operating frequency range is made larger.

Preferably, the clock cycle detection circuit produces an OR signal of a clock signal and its delay signal and smoothes the potential of the OR signal. Since the smoothed potential becomes higher as the clock cycle is shorter, the transfer circuit is activated when the potential exceeds a predetermined potential. In this case, the clock cycle detection circuit can be formed easily.

Preferably, the clock cycle detection circuit compares the cycle of the clock signal and the delay time of the delay circuit and, when the cycle of the clock signal is shorter than the delay time of the delay circuit, activates the transfer circuit. Since the delay time of the delay circuit correlates with the time for reading data, a malfunction when the clock cycle is constant and the data reading time is longer can be prevented.

Preferably, a switch circuit connected in parallel with the transfer circuit is further provided, and the switch circuit is rendered conductive when the clock cycle is shorter than a predetermined cycle. Since read data is transferred from a read circuit through the switch circuit to an output circuit in this case, the transfer time is shortened.

Preferably, the clock cycle detection circuit includes a delay circuit for delaying an activation signal for the read circuit that is generated in synchronization with an external clock signal, an erase circuit for erasing the activation signal progressing in the delay circuit in response to a pulse signal that is generated in synchronization with an internal clock signal, and a flip flop set by the pulse signal for activating the transfer circuit and reset by an output signal of the delay circuit for inactivating the transfer circuit. When the pulse signal cycle becomes shorter, the activation signal does not pass through the delay circuit and the transfer circuit is not activated. Since the delay time of the delay circuit correlates with the data reading time, a malfunction when the clock cycle is constant and the reading time is larger can be prevented.

In another aspect of the present invention, first to Nth transfer circuits are connected in series between a read circuit and an output circuit, and a clock cycle detection circuit detects whether the delay time of an external clock signal from an internal clock signal is shorter than each of first to Nth cycles and activates the first to the (N−n+1)th transfer circuits regardless of the internal clock signal when the delay time is shorter than the nth cycle. Accordingly, even when the delay time of the external clock signal from the internal clock signal is shorter than a predetermined nth cycle, the first to the (N−n+1)th transfer circuits are not activated while data is not read, and a malfunction is not caused unlike in the prior art. Thus, an operating frequency range is made larger.

Preferably, the delay time of the external clock signal from the internal clock signal is compared with the delay time of the first to the Nth delay circuits connected in series and, when the delay time of the external clock signal from the internal clock signal is shorter than the delay time of the first to the nth delay circuits, the first to the (N−n+1)th transfer circuits are activated. In this case, the clock detection circuit can be formed easily.

Preferably, first to Nth switch circuits connected in parallel with the first to the Nth transfer circuits, respectively, are further provided, and the first to the (N−n+1)th switch circuits are rendered conductive when the clock cycle is shorter than the nth cycle. Since read data is transferred through the switch circuits in this case, the transfer time is shortened.

In still another aspect of the present invention, a first signal generation circuit for producing a first activation signal for a read circuit in synchronization with an external clock signal, a second signal generation circuit for producing a second activation signal in synchronization with an internal clock signal, a clock cycle detection circuit for detecting whether a clock cycle is shorter than a predetermined cycle, and a transfer circuit activated by the first activation signal when the clock cycle is shorter than the predetermined cycle and activated by the second activation signal when the clock cycle is longer than the predetermined cycle are provided. Even when the clock cycle is shorter than the predetermined cycle, the transfer circuit is not activated while data is not read, and a malfunction is not caused unlike in the prior art. Thus, an operating frequency range is made larger.

Preferably, the clock frequency detection circuit produces an OR signal of a clock signal and its delay signal and smoothes the potential of the OR signal. Since the smoothed potential becomes higher as the clock cycle is shorter, the transfer circuit is activated when the potential exceeds a predetermined potential. In this case, the clock cycle detection circuit can be formed easily.

Preferably, the clock cycle detection circuit compares the cycle of the clock signal and the delay time of the delay circuit and, when the cycle of the clock signal is shorter than the delay time of the delay circuit, activates the transfer circuit. Since the delay time of the delay circuit correlates with the data reading time, a malfunction when the clock cycle is constant and the data reading time is longer can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit block diagram showing the configuration of a clock frequency detection circuit in an SDRAM according to a first embodiment of the present invention.

FIGS. 2A to 2C are a time chart for describing the operation of the clock frequency detection circuit shown in FIG. 1.

FIGS. 7A to 7F are a time chart showing the operation of the clock cycle detection circuit shown in FIG. 6.

FIGS. 8A to 8F are another time chart showing the operation of the clock cycle detection circuit shown in FIG. 6.

FIG. 10 is a circuit diagram showing the configuration of a signal generation circuit included in the transfer control circuit shown in FIG. 9.

FIGS. 11A to 11J are a time chart showing the operation of the SDRAM described in FIGS. 9 and 10.

FIGS. 12A to 12J are another time chart showing the operation of the SDRAM described in FIGS. 9 and 10.

FIG. 14 is a circuit diagram showing the configuration of a signal generation circuit included in the transfer control circuit shown in FIG. 13.

FIGS. 15A to 15C are a time chart showing the operation of the SDRAM described in FIGS. 13 and 14.

FIGS. 16A to 16C are another time chart showing the operation of the SDRAM described in FIGS. 13 and 14.

DESCRIPTION OF THE PREFERRED EMBODIMENTS

First Embodiment

Figure 3:
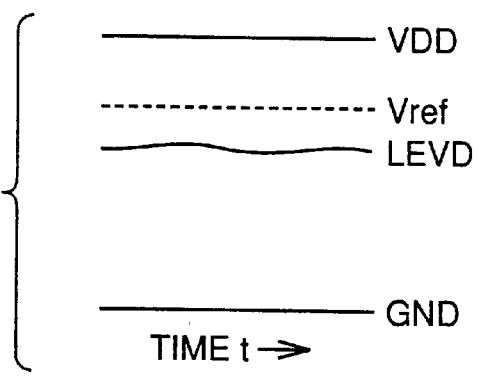
FIG. 3 is another time chart for describing the operation of the clock frequency detection circuit shown in FIG. 1.

In this embodiment, the frequency of an external clock signal CLK is detected and, when the detected frequency is higher than a predetermined frequency, a transfer control signal $\Phi 1'$ for a latch circuit LA1 is fixed to an H level. Accordingly, a transfer control signal $\Phi 1$ does not attain an H level in a pulse manner before read data DO is output to a data bus DB1, and a malfunction is not caused unlike in the prior art. As far as read data DO is output to data buses DB1, DB2 when a transfer control signal $\Phi 2$ attains an H level in a pulse manner, the read data is output to a data input/output pin DQP at a normal timing. A detailed description will be given in the following with reference to the drawings.

FIG. 1 is a circuit block diagram showing the configuration of a clock frequency detection circuit 1 in an SDRAM according to a first embodiment of the present invention. Referring to FIG. 1, clock frequency detection circuit 1 includes a delay circuit 2, an OR gate 3, a capacitor 4, resistance elements 5 to 7, and a comparator 8.

External clock signal CLK is input to one input node of an OR gate 3 and also input through delay circuit 2 to the other input node of OR gate 3. As shown in FIGS. 2A to 2C, an output signal CLKD from delay circuit 2 is delayed by predetermined delay time from clock signal CLK. Accordingly, the duty factor of an output signal LEV from OR gate 3, which is an OR signal of clock signals CLK and CLKD, becomes higher as the frequency of clock signal CLK is higher.

Capacitor 4 is connected between the output node of OR gate 3 and a ground potential GND line, and a resistance element 5 is connected between the output node of OR gate 3 and an inversion input terminal of comparator 8. Capacitor 4 and resistance element 5 constitute a smoothing circuit. An output potential LEVD (potential of the inversion input terminal of comparator 8) of the smoothing circuit is produced by smoothing output signal LEV from OR gate 3.

Resistance elements 6, 7 are connected in series between a power supply potential VDD line and a ground potential GND line, and a node N6 between resistance elements 6 and 7 is connected to a non-inversion input terminal of comparator 8. The potential of node NG is a reference potential Vref that corresponds to a predetermined frequency.

When the frequency of external clock signal CLK is lower than a predetermined frequency, output potential LEVD of the smoothing circuit becomes lower than reference potential Vref, as shown in FIG. 3 and an output signal LNG from comparator 8 is at an H level. When the frequency of external clock signal CLK is higher than a predetermined frequency, however, output potential LEVD of the smoothing circuit becomes higher than reference potential Vref, and output signal LNG from comparator 8 is at an L level.

Figure 4:
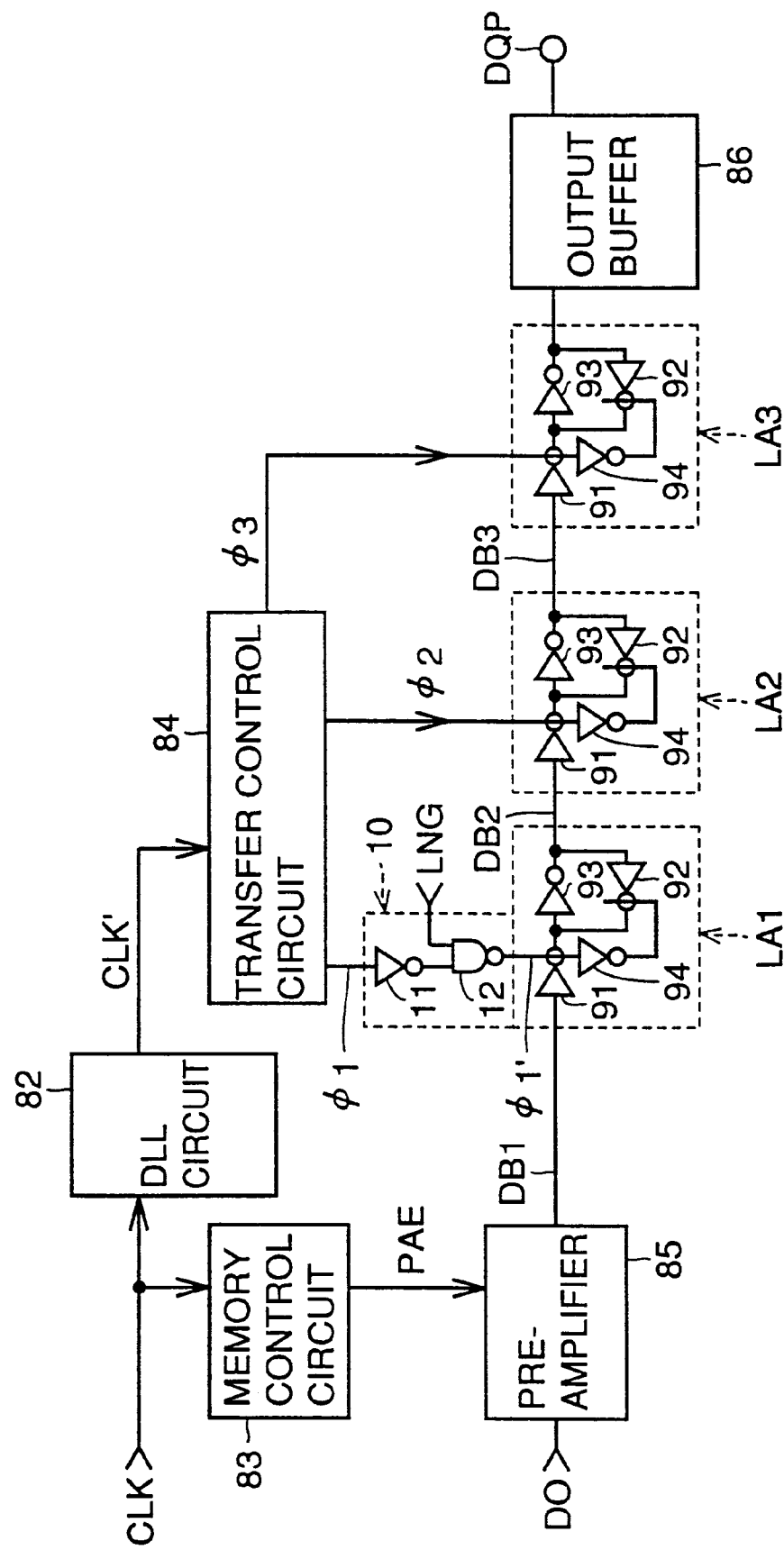
FIG. 4 is a circuit block diagram showing the configuration of a portion related to transfer and output of read data in the SDRAM described in FIG. 1.
Figure 23:
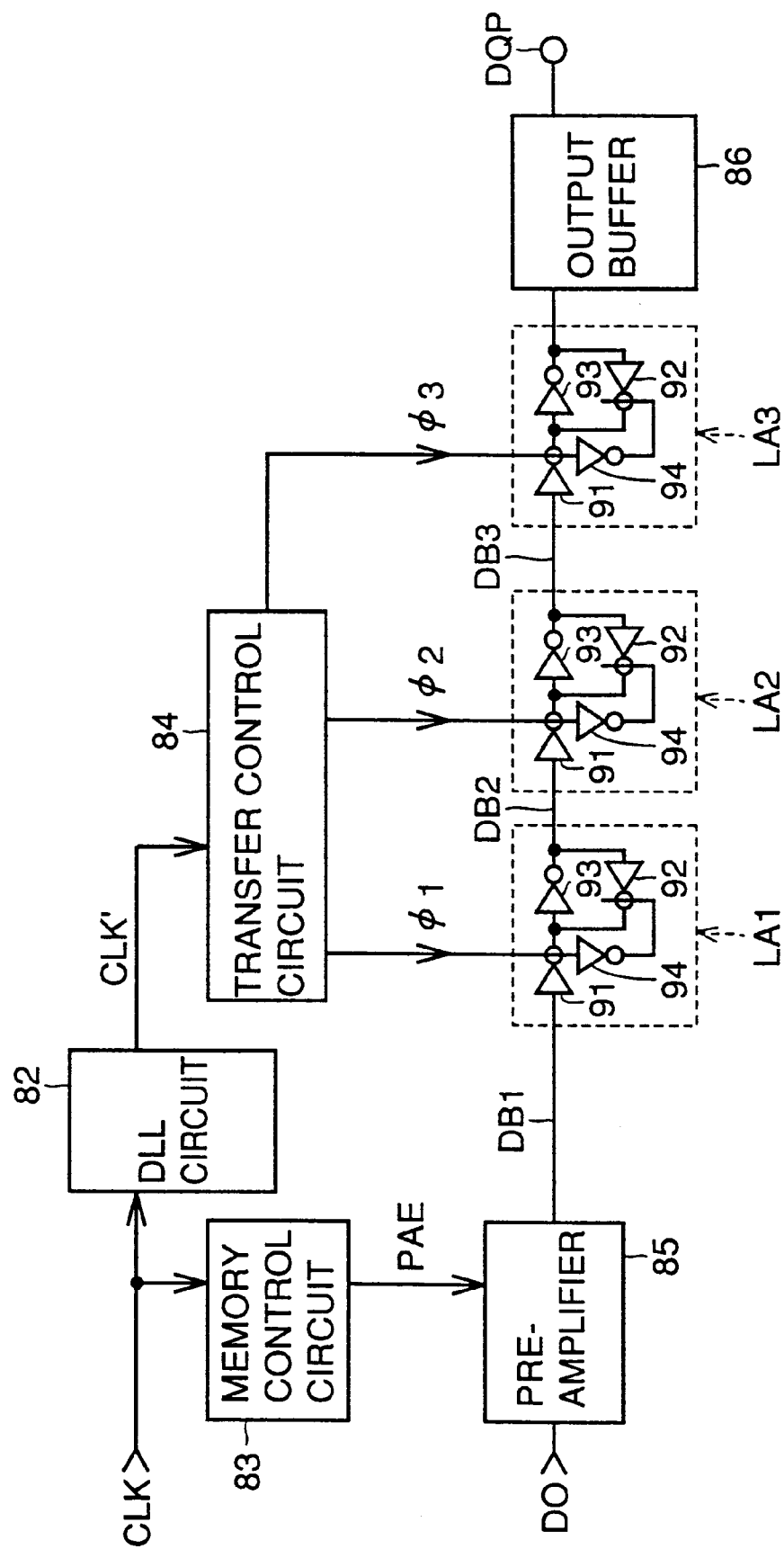
FIG. 23 is a circuit block diagram showing the configuration of a portion related to transfer and output of read data in the SDRAM shown in FIG. 22.
Figure 24A:
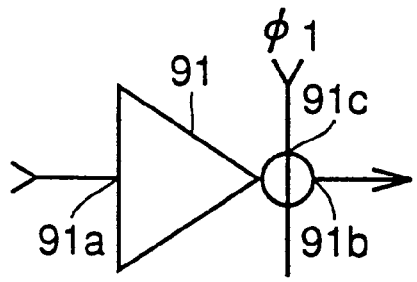
FIGS. 24A and 24B are circuit diagrams showing the configuration of the clocked inverter shown in FIG. 23.
Figure 24B:
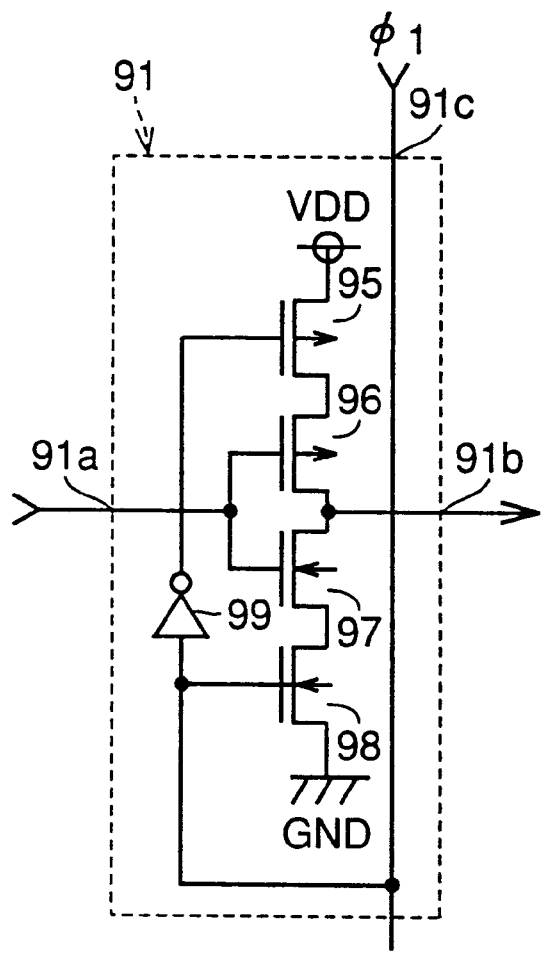
Figure 25:
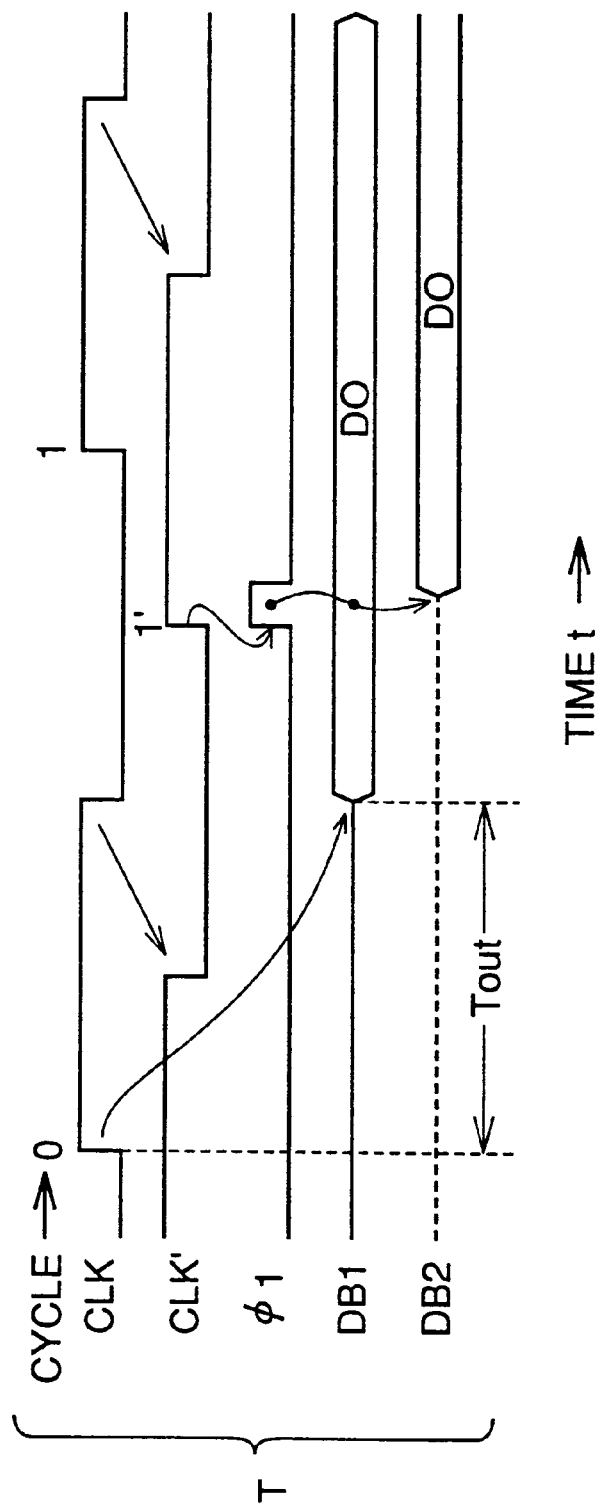
FIG. 25 is a time chart showing the operation of the SDRAM shown in FIG. 22.
Figure 26:
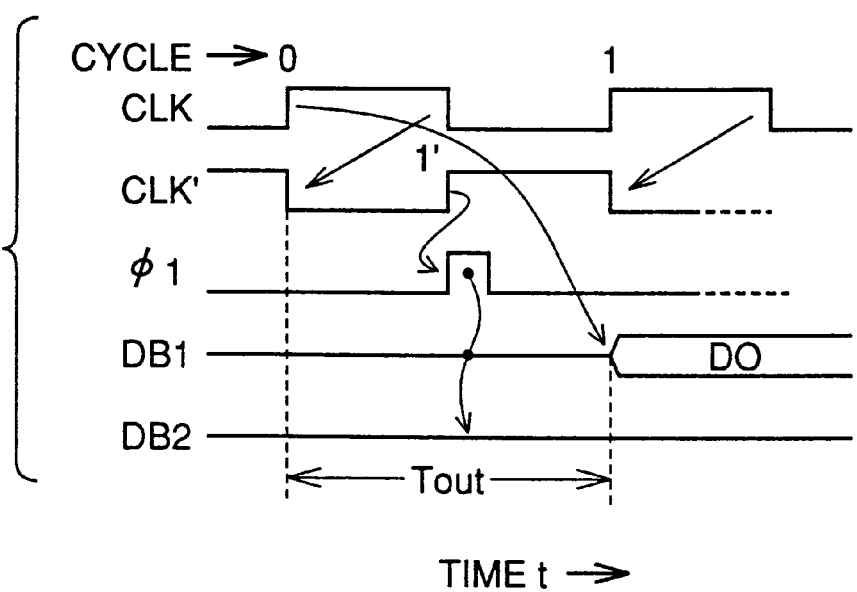
FIG. 26 is another time chart showing the operation of the SDRAM shown in FIG. 22.

FIG. 4 is a circuit block diagram, comparable to FIG. 23, showing the configuration of a portion related to transfer and output of read data DO in the SDRAM.

Referring to FIG. 4, the circuit is different from the circuit in FIG. 23 in that a gate circuit 10 is newly provided between a transfer control circuit 84 and a latch circuit LA1. Gate circuit 10 includes an inverter 11 and an NAND gate 12. Transfer control signal Φ1 is input through inverter 11 to one input node of NAND gate 12. Signal LNG produced in circuit 1 in FIG. 1 is input to the other input node of NAND gate 12. Output signal Φ1' from NAND gate 12 is input to latch circuit LA1 as a transfer control signal.

When the frequency of external clock signal CLK is lower than a predetermined frequency and signal LNG is at an H level, NAND gate 12 operates as an inverter for an output from inverter 11. Accordingly, signals Φ1' and Φ1 become the same and the circuit in FIG. 4 operates similarly to the circuit in FIG. 23.

When the frequency of external clock signal CLK is higher than a predetermined frequency and signal LNG is at an L level, however, output signal Φ1' from NAND gate 12 is fixed to an H level. Thus, clocked inverters 91 and 92 in latch circuit LA1 are activated and inactivated, respectively, and data buses DB1 and DB2 are coupled together.

In this embodiment, data DO output to data bus DB1 is transmitted as it is to data bus DB2 even when the frequency of external clock signal CLK becomes higher than an acceptable range. Accordingly, a malfunction is not caused as far as signal Φ2 attains an H level after data DO is transferred to data bus DB2. Accordingly, the acceptable range of an operating frequency is extended.

Figure 5:
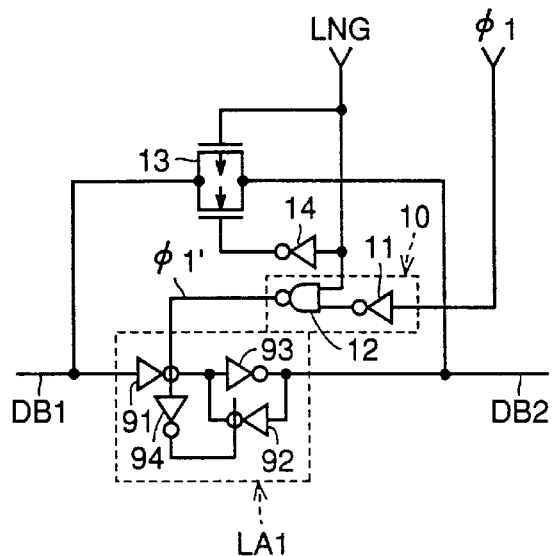
FIG. 5 is a circuit diagram showing a modification to the first embodiment.

As shown in FIG. 5, a transfer gate 13 and an inverter 14 may further be provided. Transfer gate 13 is connected in parallel with latch circuit LA1. Signal LNG is directly input to a gate of transfer gate 13 on the P channel MOS transistor side and also input through inverter 14 to a gate of transfer gate 13 on the N channel MOS transistor side.

When the frequency of external clock signal CLK is lower than a predetermined frequency and signal LNG is at an H level, transfer gate 13 is rendered non-conductive, and the circuit in FIG. 5 operates similarly to the circuits in FIG. 23.

When the frequency of external clock signal CLK is higher than a predetermined frequency and signal LNG is at an L level, however, transfer gate 13 is rendered conductive, and data buses DB1 and DB2 are coupled together through transfer gate 13. Since data DO output to data bus DB1 is transmitted through transfer gate 13 to data bus DB2 in this case, the transmission time of data DO is shortened from that of the circuit in FIG. 4 by the delay time of clocked inverter 91 and inverter 93.

Although the frequency of external clock signal CLK is detected by clock frequency detection circuit 1 in this embodiment, a similar effect can of cause be obtained even when the frequency of internal clock signal CLK' is detected by clock frequency detection circuit 1.

Second Embodiment

Figure 6:
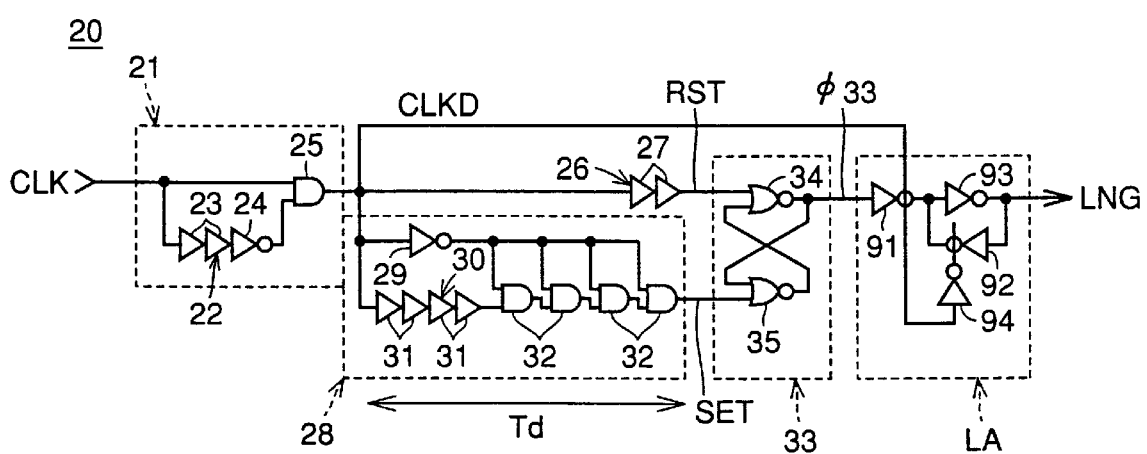
FIG. 6 is a circuit diagram showing the configuration of a clock cycle detection circuit in an SDRAM according to a second embodiment of the present invention.

FIG. 6 is a circuit diagram showing the configuration of a clock cycle detection circuit 20 in an SDRAM according to a second embodiment of the present invention.

Referring to FIG. 6, clock cycle detection circuit 20 includes a pulse generation circuit 21, a delay circuit 26, a gate circuit 28, a flip flop 33, and a latch circuit LA. Pulse generation circuit 21 includes a delay circuit 22 and an NAND gate 25, and delay circuit 22 has a plurality of (two in the Figure) buffers 23 connected in series and an inverter 24. External clock signal CLK is directly input to one input node of AND gate 25 and also input through delay circuit 22 to the other input node of AND gate 25. An output signal from AND gate 25, that is, output signal CLKD from pulse generation circuit 21 becomes a pulse signal that rises simultaneously with a rise of external clock signal CLK and falls after the delay time of delay circuit 22.

Delay circuit 26 includes a plurality of (two in the Figure) buffers 27 connected in series, an produces a reset signal RST for flip flop 33 by delaying signal CLKD.

Gate circuit 28 includes an inverter 29, a delay circuit 30, and a plurality of (four in the Figure) AND gates 32 connected in series, and delay circuit 30 has a plurality of (four in the Figure) buffers 31 connected in series. Signal CLKD is input through inverter 29 to one input node of each AND gate 32 and also input through delay circuit 30 to the other input node of AND gate 32 at the first stage. An output from each of AND gates 32 is input to the other input node of AND gate 32 at a subsequent stage. Signal CLKD is delayed predetermined time Td by delay circuit 30 and a series of AND gates 32. Delay time Td is larger than the delay time of delay circuit 26. An output from AND gate 32 at the last stage is a set signal SET for flip flop 33.

When the cycle of external clock signal CLK is shorter than delay time Td and a next pulse of signal CLKD is generated while a certain pulse of signal CLKD is transmitted through a series of AND gates 32, the pulse is inverted by inverter 29 and input to one input node of each AND gate 32, and the certain pulse is erased. When the cycle of external clock signal CLK is longer than delay time Td and a next pulse of signal CLKD is not generated while a certain pulse of signal CLKD is transmitted through a series of AND gates 32, the certain pulse passes through the series of AND gates 32.

Flip flop 33 includes NOR gates 34, 35, and it is set when set signal SET attains an H level in a pulse manner, and reset when reset signal RST attains an H level in a pulse manner. An output signal Φ33 from flip flop 33 keeps an H level only while flip flop 33 is set.

Similarly to above described latch circuit LA1 above, latch circuit LA is formed of clocked inverters 91, 92 and inverters 93, 94. Output signal Φ33 from flip flop 33 is input to the input node of clocked inverter 91, and output signal CLKD from pulse generation circuit 21 is directly input to the control node of clocked inverter 91 and also input through inverter 94 to the control node of clocked inverter 92. An output signal from inverter 93, that is, an output signal from latch circuit LA becomes signal LNG. Latch circuit LA receives and transmits input signal Φ33 while signal CLKD is at an H level, and latches received signal Φ33 while signal CLKD is at an L level.

The operation of clock cycle detection circuit 20 shown in FIG. 6 will be described in the following. FIGS. 7A to 7F are a time chart showing the operation of clock cycle detection circuit 20 when the cycle of external clock signal CLK is longer than predetermined time Td.

When external clock signal CLK is supplied, pulse generation circuit 21 produces signal CLKD that rises in response to a rise of external clock signal CLK and falls after the delay time of delay circuit 22. Signal CLKD is delayed by delay circuit 26 and becomes reset signal RST. When reset signal RST attains an H level in a pulse manner, flip flop 33 is reset and signal Φ33 becomes an L level.

Signal CLKD is input to gate circuit 28. When the cycle of external clock signal CLKD is longer than time Td, a next pulse is not generated while a certain pulse of signal CLKD progresses in a series of AND gates 32, and therefore the pulse passes through gate circuit 28. Accordingly, set signal SET attains an H level in a pulse manner and output signal Φ33 from flip flop 33 rises to an H level, as shown in FIGS. 7D, 7E.

When a next pulse of signal CLKD is generated, output signal Φ33 from flip flop 33 is received and latched by latch circuit LA in response to the signal. Accordingly, signal LNG attains an H level.

FIGS. 8A to 8F are a time chart showing the operation of clock cycle detection circuit 20 when the cycle of external clock signal CLK is shorter than predetermined time Td.

When external clock signal CLK is supplied, signal CLKD is produced by pulse generation circuit 21, and signal CLKD is delayed by delay circuit 26 and changed to reset signal RST. Flip flop 33 is reset by reset signal RST, and signal Φ33 is at an L level.

Signal CLKD is input to gate circuit 28. When the cycle of external clock signal CLK is shorter than predetermined time Td, a next pulse is generated while a certain pulse of signal CLKD progresses in a series of AND gates 32, and therefore the pulse is erased without passing through gate circuit 28. Accordingly, set signal SET remains to be an L level and output signal Φ33 from flip flop 33 is fixed to an L level, as shown in FIGS. 8D, 8E. Thus, signal LNG is at an L level.

Since other configuration and operation are the same as the SDRAM in the first embodiment, the description will not be repeated.

The same effect as the first embodiment is also obtained in this embodiment.

Since read-related circuits in the SDRAM include a large number of buffers, inverters and the like, data reading time Tout is correlated with the above described delay time Td, and increase/decrease of Tout results in increase/decrease of Td in accordance with the using condition of the SDRAM. Accordingly, clock cycle detection circuit 20 also functions as a circuit for monitoring the relations between a clock cycle and data reading time Tout.

Third Embodiment

Figure 9:
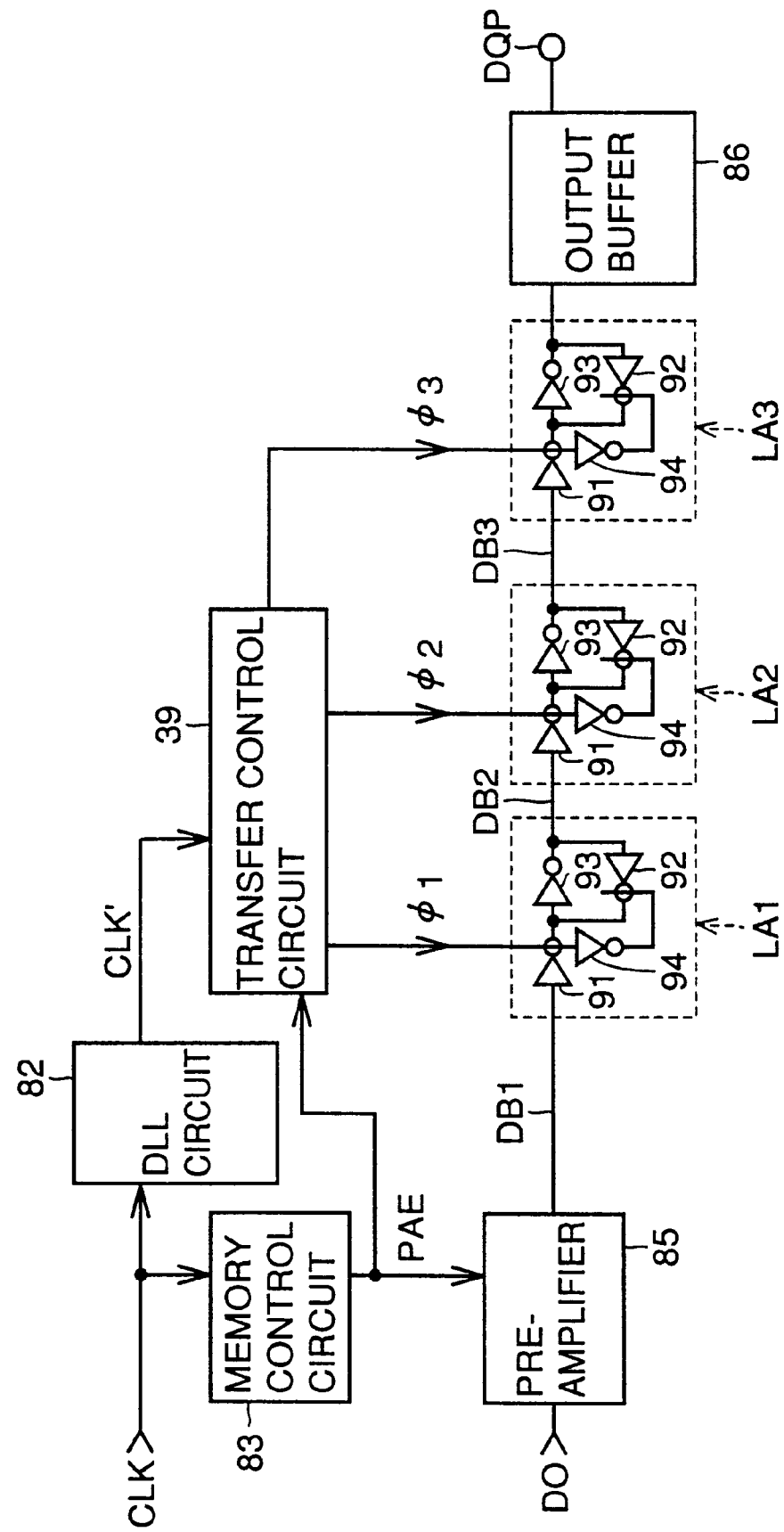
FIG. 9 is a circuit block diagram showing the configuration of a portion related to transfer and output of read data in an SDRAM according to a third embodiment of the present invention.

FIG. 9 is a circuit block diagram, comparable with FIG. 23, showing the configuration of a portion related to transfer and output of read data DO in an SDRAM according to a third embodiment of the present invention.

Referring to FIG. 9, the circuit is different from the circuit in FIG. 23 in that transfer control circuit 84 is replaced by a transfer control circuit 39 and preamplifier activation signal PAE is also input to transfer control circuit 39.

Transfer control circuit 39 includes a signal generation circuit 40 in FIG. 10. Signal generation circuit 40 includes a pulse generation circuit 41, a gate circuit 42, and a flip flop 45. Pulse generation circuit 41 includes delay circuit 22 and AND gate 25 similarly to pulse generation circuit 21 in FIG. 6, and produces a signal that rises in response to a rising edge of internal clock signal CLK' and falls after the delay time of delay circuit 22. The signal becomes set signal SET for flip flop 45.

Gate circuit 42 includes an inverter 43 and a plurality of (four in the Figure) AND gates 44 connected in series. Set signal SET is input through inverter 43 to one input node of each AND gate 44. Signal PAE is input to the other input node of AND gate 44 at the first stage. An output signal from each AND gate 44 is input to the other input node of AND gate 44 at a subsequent stage. An output signal from AND gate 44 at the last stage becomes reset signal RST of flip flop 45.

When the clock cycle is longer than a predetermined cycle and a plus pulse of set signal SET is not generated while signal PAE progresses in a series of AND gates 44, signal PAE passes through the series of AND gates 44. When the clocked cycle is shorter than a predetermined cycle and a plus pulse of set signal SET is generated while signal PAE progresses in the series of AND gates 44, the plus pulse is inverted by inverter 43 and input to one input node of AND gate 44, and thus signal PAE is erased.

Flip flop 45 includes NOR gates 46, 47, and it is set when set signal SET attains an H level in a pulse manner and reset when reset signal RST attains an H level in a pulse manner. An output signal from flip flop 45 keeps its H level only while flip flop 45 is set. The output signal of flip flop 45 becomes signal Φ1. Signals Φ2 and Φ3 are produced similarly to a conventional manner.

The operation of the SDRAM shown in FIGS. 9 and 10 will be described in the following. FIGS. 11A to 11J are a time chart showing the operation of the SDRAM when the clock cycle is longer than a predetermined cycle.

When external clock signal CLK is supplied, DLL circuit 82 produces internal clock signal CLK' of which rising/falling timing is made earlier by predetermined time at the same frequency as external clock signal CLK. In response to the rising edge of external clock signal CLK in a certain cycle 0, signal PAE rises to an H level in a pulse manner, and read data DO1 is output to data bus DB1.

When internal clock signal CLK' is produced, pulse generation circuit 41 produces signal SET that rises in response to a rising edge of internal clock signal CLK' and falls after the delay time of delay circuit 22.

When the clock cycle is longer than a predetermined cycle, set signal SET does not rise to an H level while a plus pulse of signal PAE progresses in a series of AND gates 44, and therefore the plus pulse passes through the series of AND gates 44. Accordingly, reset signal RST attains an H level in a pulse manner and output signal Φ1 from flip flop 45 is at an L level as shown in FIGS. 11E, 11G.

When set signal SET rises to an H level in a pulse manner in response to the rising edge of internal clock signal CLK' in cycle 1', which corresponds to the rising edge of external clock signal CLK in cycle 1, flip flop 45 is set in response to this pulse and signal Φ1 rises to an H level. Accordingly, clocked inverters 91 and 92 in latch circuit LA1 are activated and inactivated, respectively, and data DO on data bus DB1 is transmitted to data bus DB2.

Further, signals Φ2, Φ3 attain an H level in a pulse manner in response to the rising edges of internal clock signal CLK' in cycles 2', 3', and read data DO is output to data input/output pin DQP after predetermined time since the rising edge of internal clock signal CLK' in cycles 3'.

FIGS. 12A to 12J are a time chart showing the operation of the SDRAM when the clock cycle is shorter than a predetermined cycle.

When external clock signal CLK is supplied, internal clock signal CLK' is produced, signal PAE rises to an H level in a pulse manner in response to the rising edge of external clock signal CLK in a certain cycle 0, and read data DO1 is output to data bus DB1. Further, set signal SET is produced in synchronization with internal clock signal CLK'.

When the clock cycle is shorter than a predetermined cycle, set signal SET rises to an H level while a plus pulse of signal PAE progresses in a series of AND gates 44, and therefore the plus pulse disappears without passing through the series of AND gate 44. Accordingly, reset signal RST remains to be an L level and output signal Φ1 from flip flop 46 is fixed to an H level as shown in FIGS. 12E, 12G. Thus, clocked inverters 91 and 92 in latch circuit LA1 are activated and inactivated, respectively, and data buses DB1 and DB2 are coupled together.

In this embodiment, even when the clock cycle becomes shorter than a predetermined cycle, data DO1 output to data bus DB1 is transmitted as it is to data bus DB2. Accordingly, a malfunction is not caused as far as signal Φ2 attains an H level after data DO1 is transmitted to data bus DB2. Therefore, the acceptable range of an operating frequency is extended.

Fourth Embodiment

Figure 13:
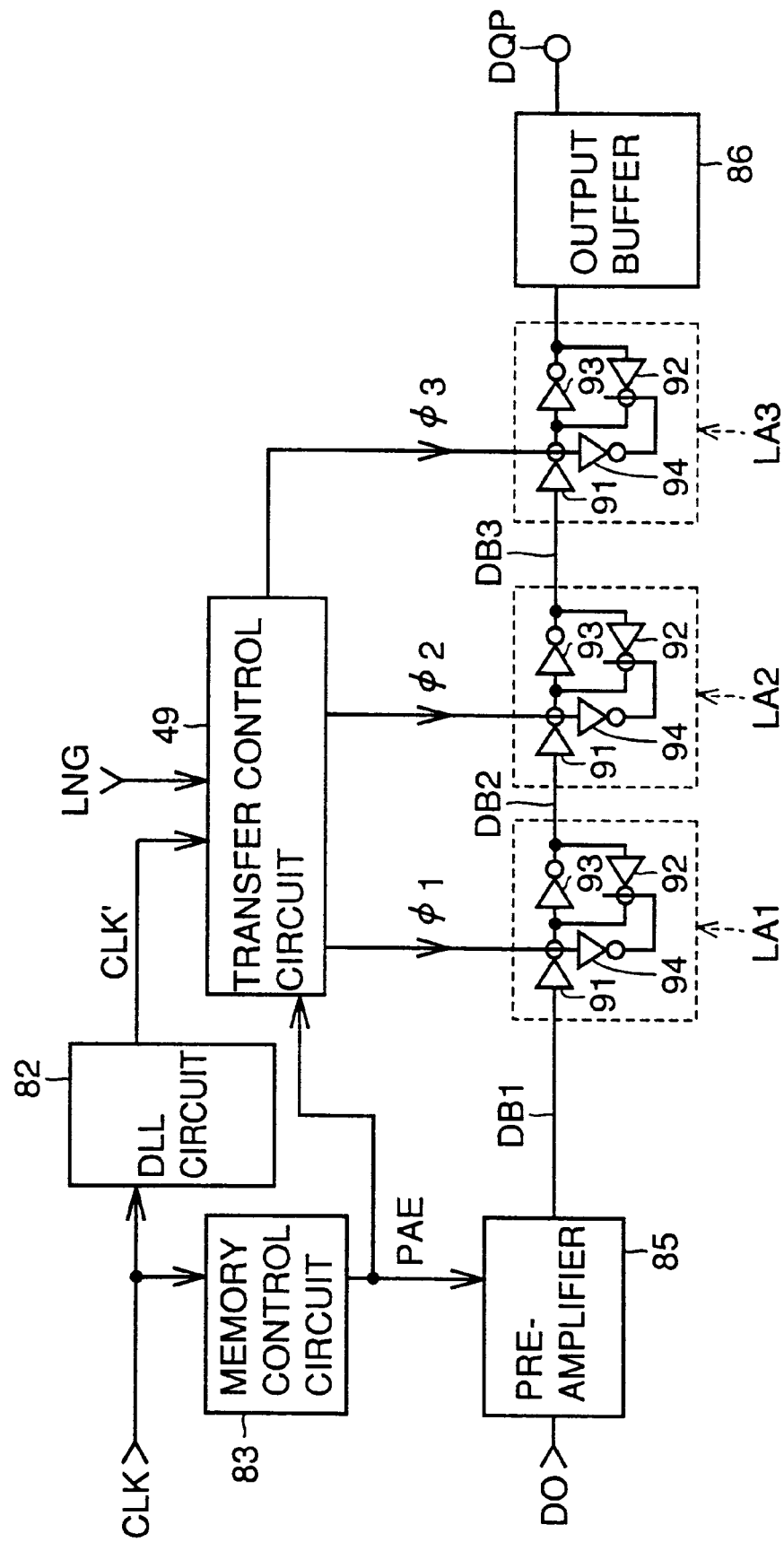
FIG. 13 is a circuit block diagram showing the configuration of a portion related to transfer and output of read data in an SDRAM according to a fourth embodiment of the present invention.

FIG. 13 is a circuit block diagram, comparable with FIG. 23, showing the configuration of a portion related to transfer and output of read data DO in an SDRAM according to a fourth embodiment of the present invention.

Referring to FIG. 13, the circuit is different from the circuit in FIG. 23 in that transfer control circuit 84 is replaced by a transfer control circuit 49 and signals PAE, LNG are input to transfer control circuit 49. Signal LNG is a signal that is at an H level when its clock cycle is longer than a predetermined cycle and that is at an L level when its clock cycle is shorter than a predetermined cycle. Signal LNG is produced in the circuit in FIG. 1 or FIG. 6.

Transfer control circuit 49 includes a signal generation circuit 50 in FIG. 14. Signal generation circuit 50 includes a pulse generation circuit 51, a delay circuit 52, and a selector 54. Pulse generation circuit 51 includes delay circuit 22 and AND gate 25 similarly to pulse generation circuit 21 in FIG. 6, and produces signal CLKD' that rises in response to a rising edge of internal clock signal CLK' and falls after the delay time of delay circuit 22.

Delay circuit 52 includes a plurality of (three in the Figure) buffers 53 connected in series, and produces a signal PAED by delaying preamplifier activation signal PAE. For example, read data DO1 is output to data bus DB1 after prescribed time since signal PAE attains an H level in a pulse manner, as shown in FIG. 11. Delay circuit 52 has delay time that is equal to the prescribed time. Accordingly, signal PAED rises to an H level in a pulse manner at the same timing at which read data DO1 is output to data bus DB1.

Selector 54 includes an inverter 55, AND gates 56, 57, and an OR gate 58. Signal CLKD' is input to one input node of AND gate 56. Signal LNG is directly input to the other input node of AND gate 56 and also input through inverter 55 to one input node of AND gate 57. Signal PAED is input to the other input node of AND gate 57. OR gate 58 receives output signals from AND gates 56, 57. An output signal from OR gate 58, that is, an output signal from selector 54 becomes signal Φ1. Signal PAED becomes signal Φ1 when signal LNG is at an L level, and signal CLKD' becomes signal Φ1 when signal LNG is at an H level.

The operation of the SDRAM shown in FIGS. 13 and 14 will be described briefly in the following. When the clock cycle is longer than a predetermined cycle and signal LNG is at an H level, signal CLKD' is selected by selector 54 and it becomes signal Φ1. In this case, signal Φ1 rises to an H level in a pulse manner in response to a rising edge of internal clock signal CLK' as shown in FIGS. 15A to 15C, and the circuit in FIG. 13 operates similarly to the circuit in FIG. 23.

When the clock cycle is shorter than a predetermined cycle and signal LNG is at an L level, signal PADE is selected by selector 54, and Φ1 attains an H level in pulse manner in response to signal PADE as shown in FIGS. 1GA to 16C. Since signal Φ1 attains an H level in a pulse manner when read data DO is output to data bus DB1 in FIG. 13, signal Φ1 does not attain an H level in a pulse manner before read data DO is output to data bus DB1, and a malfunction is not caused unlike in the prior art.

Fifth Embodiment

Figure 17:
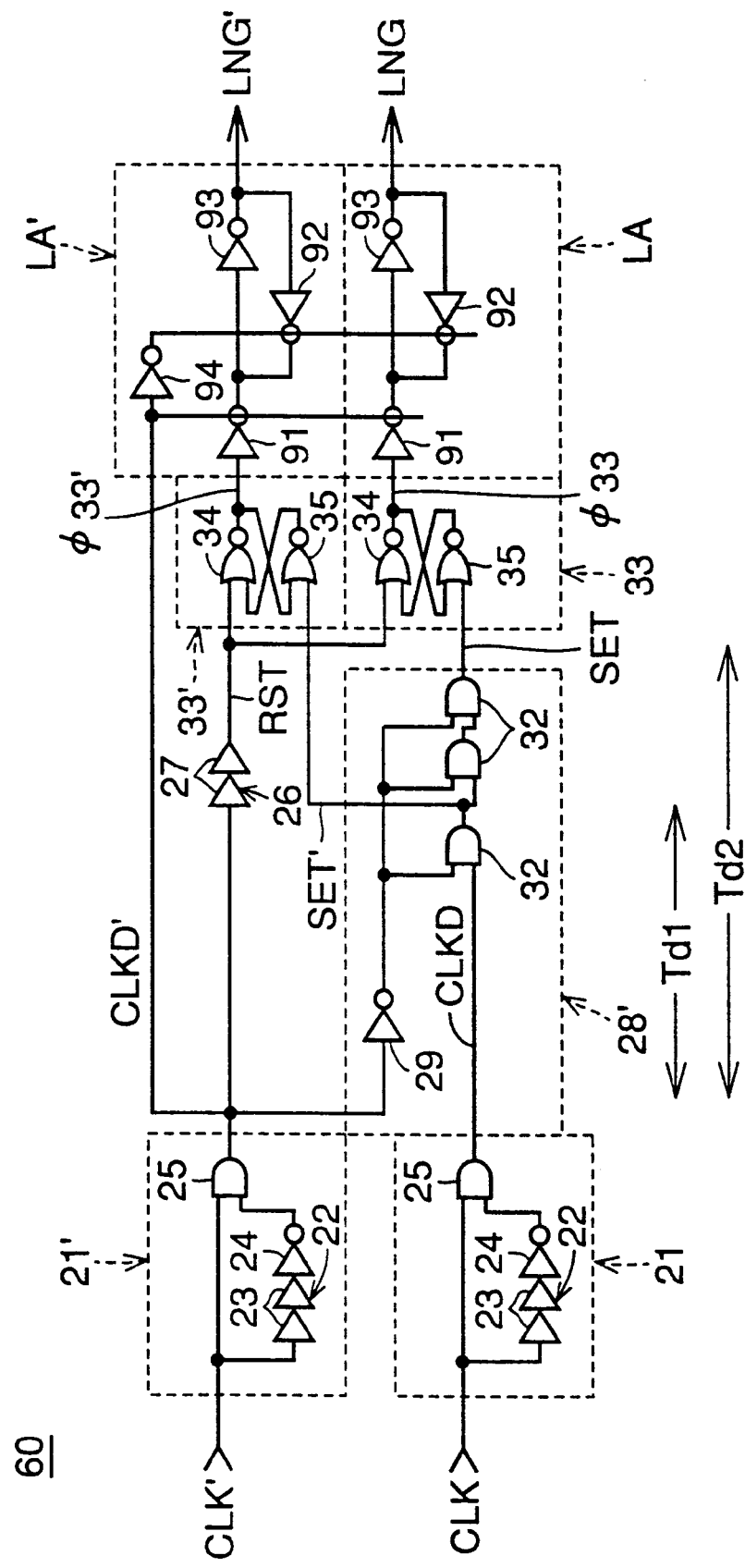
FIG. 17 is a circuit diagram showing the configuration of a clock cycle detection circuit in an SDRAM according to a fifth embodiment of the present invention.

FIG. 17 is a circuit diagram showing the configuration of a clock cycle detection circuit 60 in an SDRAM according to a fifth embodiment of the present invention.

Referring to FIG. 17, clock cycle detection circuit 60 is different from clock cycle detection circuit 17 in FIG. 6 in that a pulse generation circuit 21', a flip flop 33' and a latch circuit LA' are newly provided, gate circuit 28 is replaced by a gate circuit 28', and signals LNG, LNG' are output in response to internal clock signal CLK'.

Gate circuit 28' is the same as gate circuit 28 without delay circuit 30 and one AND gate 32. Output signal CLKD from pulse generation circuit 21 is directly input to the other input node of AND gate 32 at the first stage.

Internal clock signal CLK' is input to pulse generation circuit 21'. Output signal CLKD' from pulse generation circuit 21' is input to the control nodes of clocked inverters 91 in latch circuits LA, LA' and also input through inverter 94 to the control nodes of clocked inverters 92. Flip flop 33' is supplied with a set signal SET' and reset signal RST. Set signal SET' is an output signal from AND gate 32 at a prescribed stage (the first stage in the Figure) other than the last stage of a series of AND gates 32. Reset signal RST is an output signal from delay circuit 26 and is also input to flip flop 33. An output signal Φ33' from flip flop 33' is input to clocked inverter 91 in latch circuit LA'. Output signals from latch circuits LA, LA' become signals LNG, LNG', respectively.

Signal CLKD' is delayed predetermined time Td1 by AND gate 32 of one stage, and delayed predetermined time Td2 (Td2>Td1) by AND gates 32 of three stages. When the time from a rise of external clock signal CLK to a rise of internal clock signal CLK' is longer than Td2, a plus pulse of signal CLKD passes through AND gates 32 of three stages and sets flip flops 33, 33', and therefore signals LNG, LNG' are both at an H level.

When the time from a rise of external clock signal CLK to a rise of internal clock signal CLK' is longer than Td1 but shorter than Td2, a plus pulse of signal CLKD passes through AND gate 32 of one stage and sets only flip flop 33', and therefore signals LNG, LNG' are at L and H levels, respectively. When the time from a rise of external clock signal CLK to a rise of internal clock signal CLK' is shorter than Td1, a plus pulse of signal CLKD is erased in a series of AND gates 32. Since flip flops 33, 33' are not set, signal LNG, LNG' are both at an L level.

Figure 18:
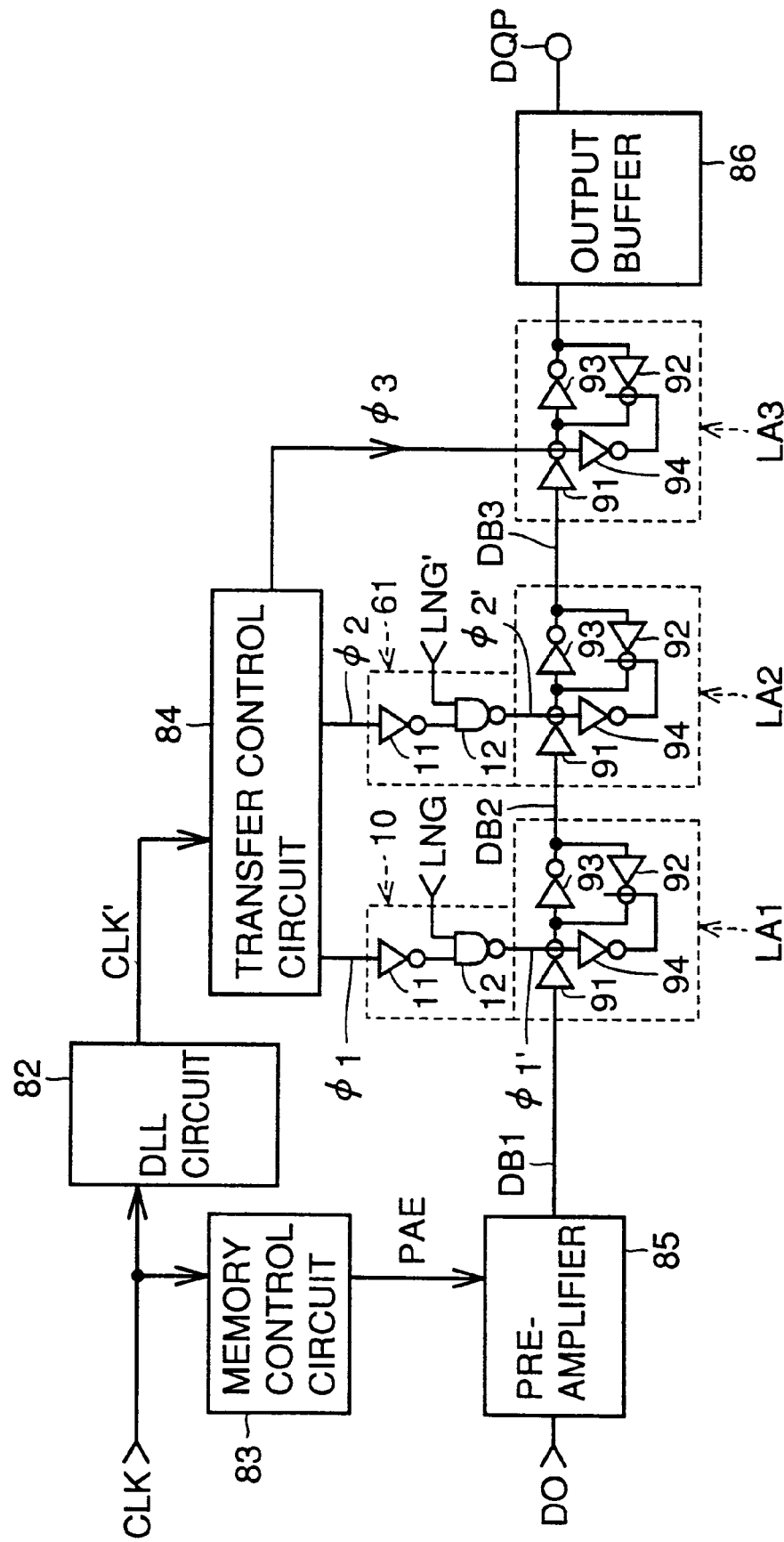
FIG. 18 is a circuit block diagram showing the configuration of a portion related to transfer an output of read data in the SDRAM described in FIG. 17.
Figure 19:
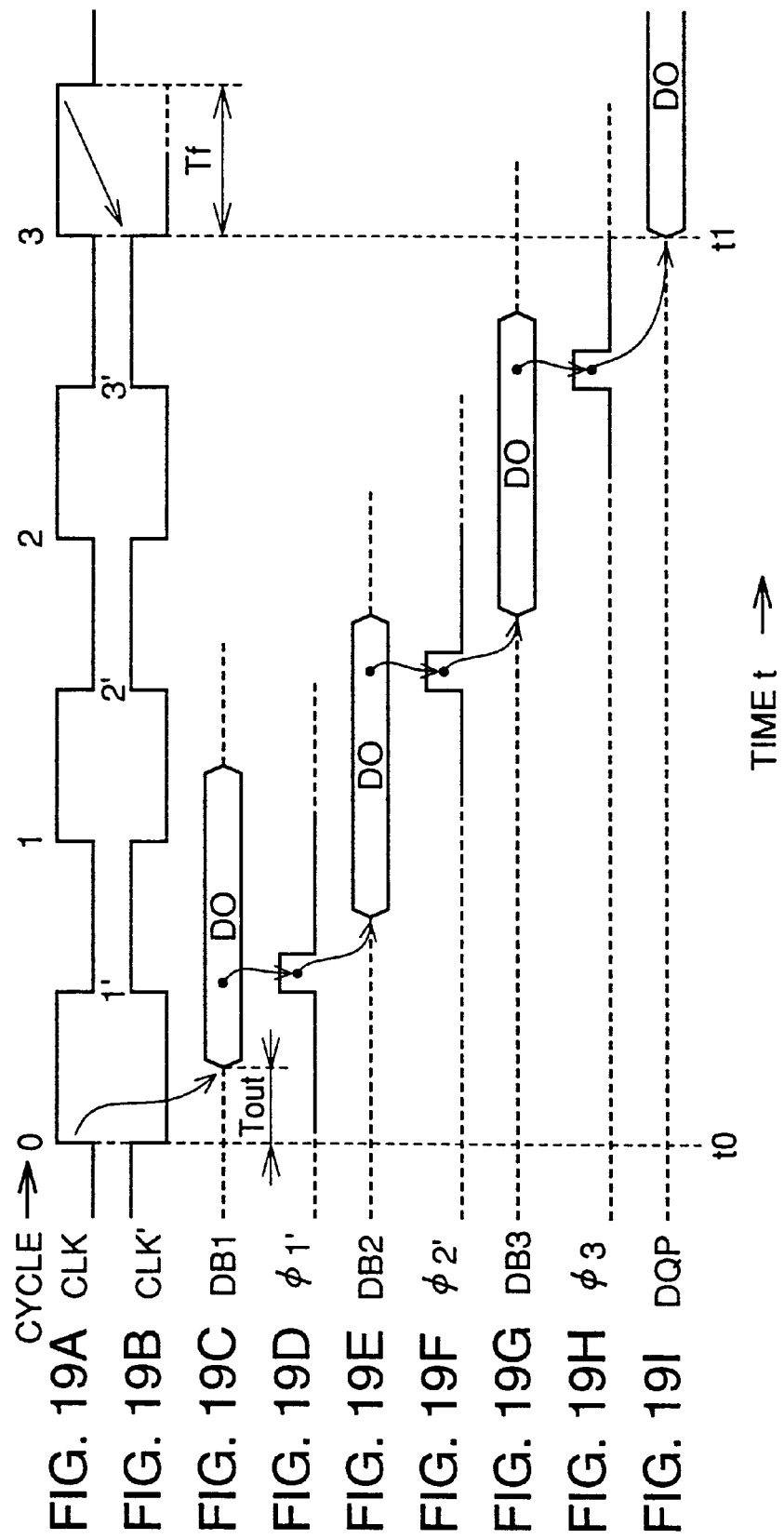
FIGS. 19A to 19I are a time chart showing the operation of the SDRAM described in FIGS. 17 and 18.
Figure 20:
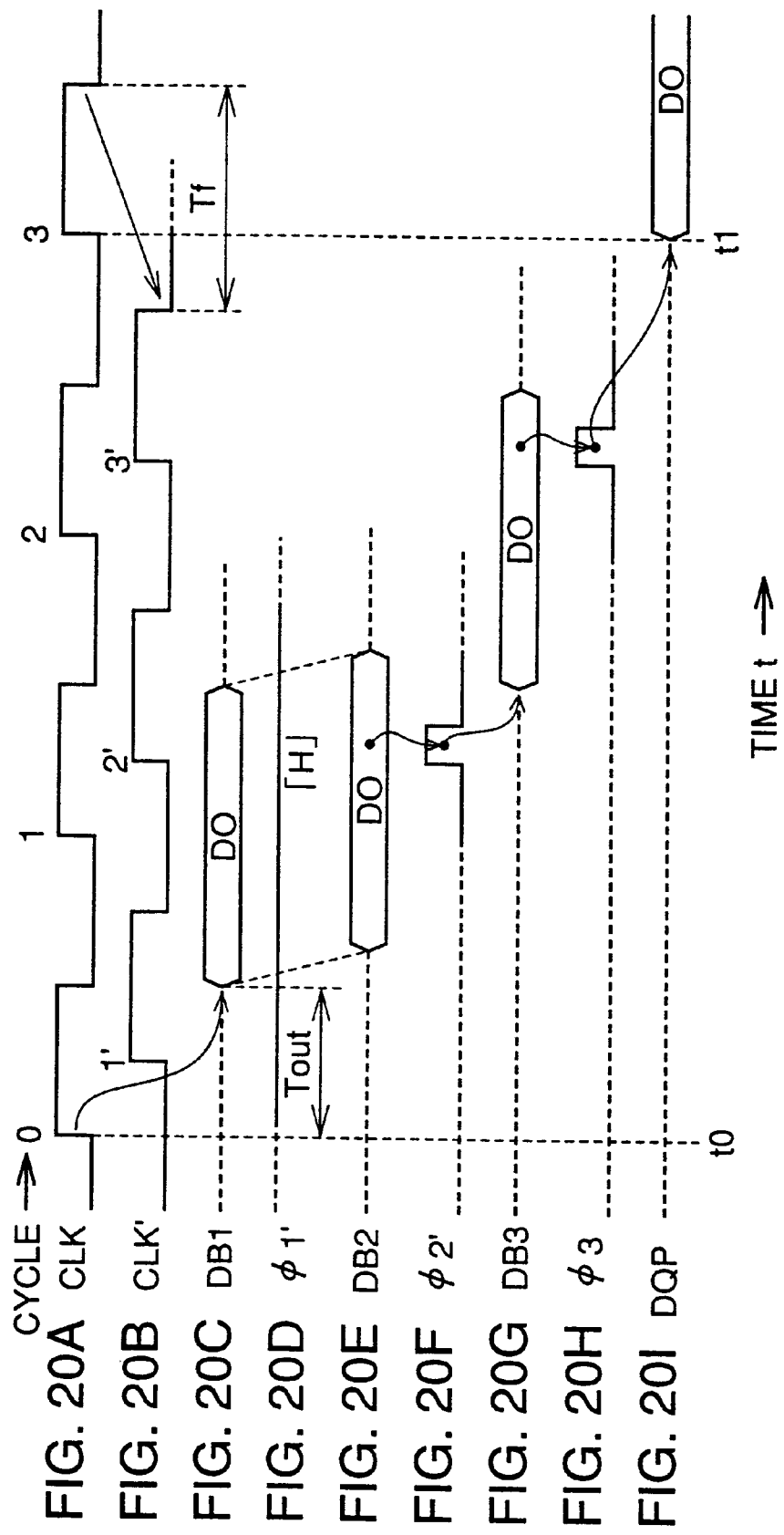
FIGS. 20A to 20I are another time chart showing the operation of the SDRAM described in FIGS. 17 and 18.
Figure 21:
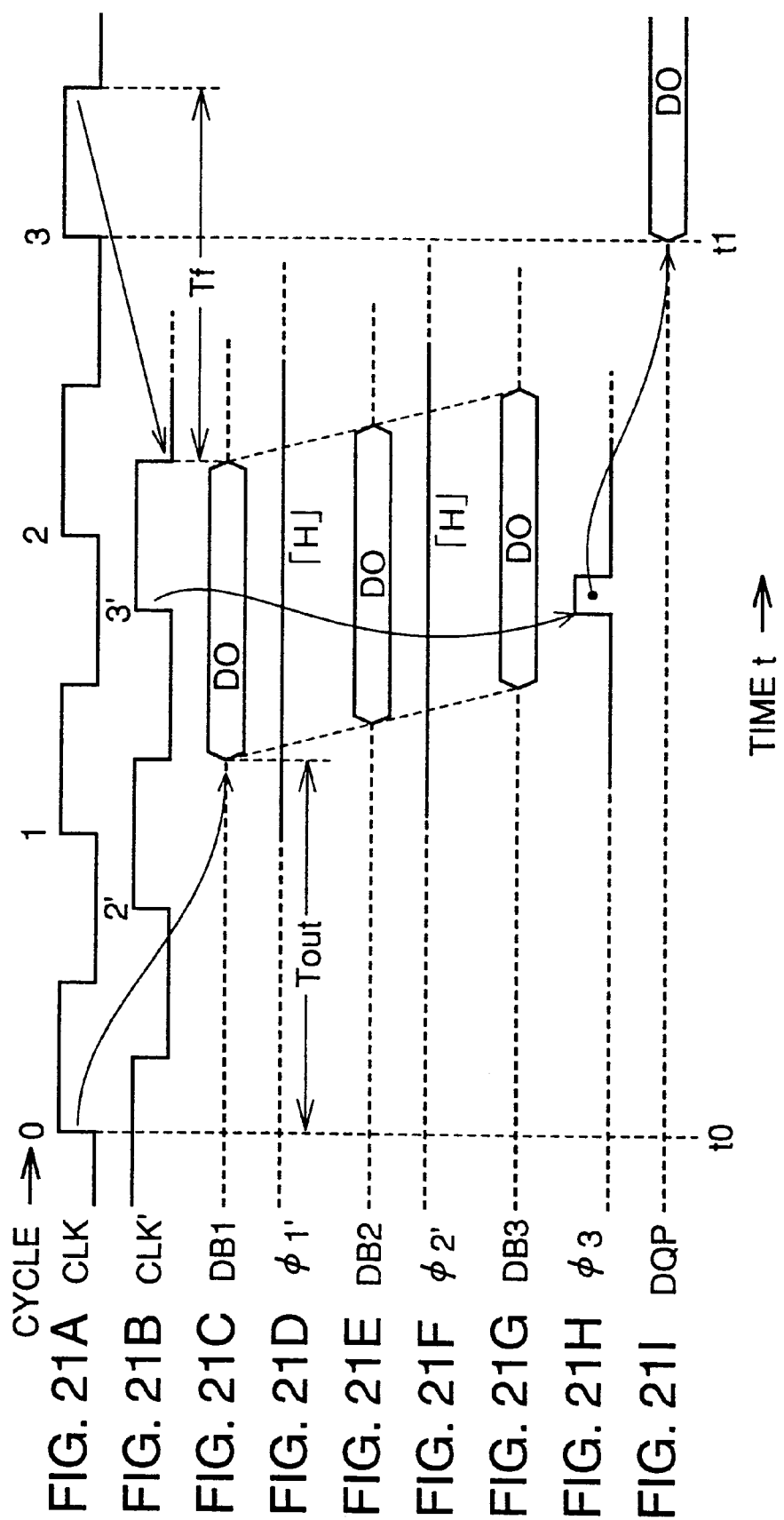
FIGS. 21A to 21I are still another time chart showing the operation of the SDRAM described in FIGS. 17 and 18.
Figure 22:
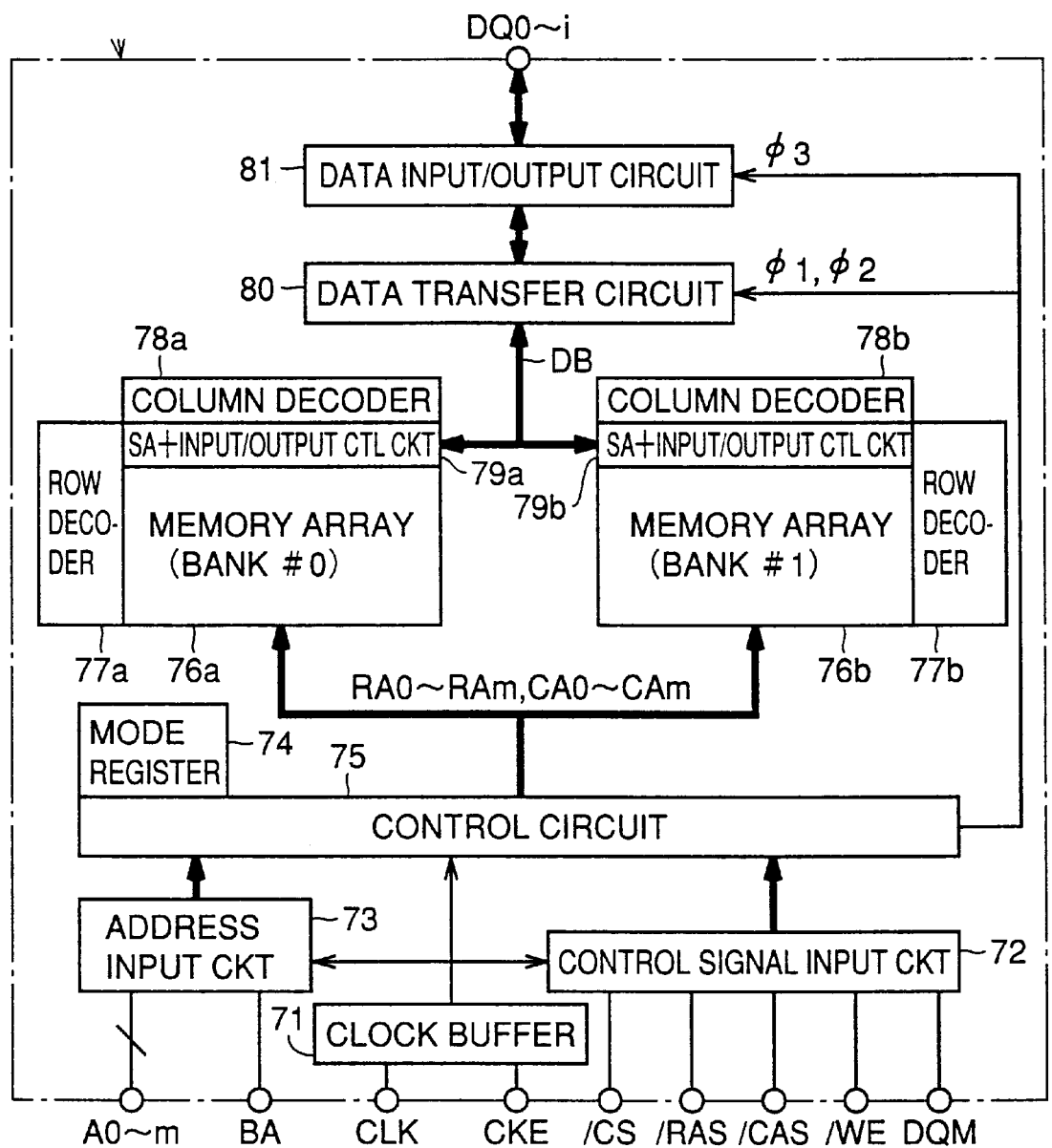
FIG. 22 is a block diagram showing the overall configuration of a conventional SDRAM.

FIG. 18 is a circuit block diagram, comparable with FIG. 4, showing a portion related to transfer and output of read data DO in the SDRAM.

Referring to FIG. 18, the circuit is different from the circuit in FIG. 4 in that a gate circuit 61 is newly provided between transfer control circuit 84 and latch circuit LA2. Gate circuit 61 includes inverter 11 and NAND gate 12 similarly to gate circuit 10. Transfer control circuit Φ2 is input through inverter 11 to one input node of NAND gate 12. Signal LNG' that is produced in clock cycle detection circuit 60 in FIG. 17 is input to the other input node of NAND gate 12. Output signal Φ2' from NAND gate 12 is input as a transfer control signal to latch circuit LA2.

When signals LNG, LNG' are both at an H level since the time from a rise of external clock signal CLK to a rise of internal clock signal CLK' is longer than Td2, signals Φ1, Φ2 pass through gate circuits 10, 61 as they are and become signals Φ1', Φ2'. In this case, the circuit in FIG. 18 operates similarly to the circuit in FIG. 23.

When signals LNG, LNG' are at L and H levels, respectively, since the time from a rise of external clock signal CLK to a rise of internal clock signal CLK' is longer than Td1 but shorter than Td2, signal Φ1' is fixed to an H level and signal Φ2 becomes signal Φ2'. In this case, data buses DB1 and DB2 are always coupled together, and data DO that is output from preamplifier 85 to data bus DB1 is not adjusted in timing in latch circuit LA1, and it is transmitted to data bus DB2.

When signals LNG, LNG' are both at an L level since the time from a rise of external clock signal CLK to a rise of internal clock signal CLK' is shorter than Td1, signals Φ1', Φ2' are fixed to an H level. In this case, data buses DB1, DB2 and DB3 are always coupled together, and data DO that is output from preamplifier 85 to data bus DB1 is not adjusted in timing in latch circuits LA1, LA2, and it is transmitted to data buses DB2, DB3.

The operation of the SDRAM shown in FIGS. 17 and 18 will be described in the following. Since read-related circuits and the DLL circuit in the SDRAM each include a plurality of buffers and inverters, data reading time Tout as well as progress time Tf of external clock signal CLK' from external clock signal CLK are correlated with delay times Td2, Td1 in FIG. 17, and therefore increase/decrease of Tout, Tf due to the using condition of the SDRAM result in increase/decrease of Td2, Td1. Accordingly, when Tout, Tf are changed in accordance with the using condition of the SDRAM, for example, latch circuits LA1, LA2 are controlled in accordance with the changes even when the clock cycle is constant.

In other words, when Tout, Tf are short and Td1, Td2 are shorter than the time from a rise of external clock signal CLK to a rise of internal clock signal CLK', signals LNG, LNG' are both at an H level, and signals Φ1', Φ2', Φ3 rise to an H level in a pulse manner in synchronization with the rising edges of internal clock signal CLK' in cycles 1' to 3', as shown in FIGS. 19A to 19I. Data DO that is read to data bus DB1 in synchronization with the rising edge of external clock signal CLK in cycle 0 is transmitted from data bus DB1 to data bus DB2, to data bus DB3, and to output buffer 86 in synchronization with signals Φ1', Φ2', Φ3, and data DO is output to data input/output pin DQP in synchronization with the rising edge of external clock signal CLK in cycles 3.

When Tout is longer than an acceptable value, Tf is shorter than an acceptable value and the time from a rise of internal clock signal CLK to a rise of internal clock signal CLK' is between Td1 and Td2, signals LNG, LNG' are at L and H levels, respectively. Further, signal Φ1' is fixed to an H level, and signals Φ2', Φ3 attain an H level in a pulse manner in synchronization with the rising edges of internal clock signal CLK' in cycle 2', 3', as shown in FIGS. 20A to 20I. Data DO that is read to data bus DB1 in response to the rising edge of external clock signal CLK in cycle 0 is not adjusted in timing in latch circuit LA1 but data DO is transmitted to data bus DB2, and transmitted to data bus DB3 and output buffer 86 in synchronization with signals Φ2', Φ3'. Output buffer 86 outputs data DO to data input/output pin DQP in synchronization with the rising edge of external clock signal CLK in cycle 3.

When Tout, Tf are sufficiently longer than an acceptable value and the time from a rise of external clock signal CLK to a rise of internal clock signal CLK' is shorter than Td1, signals LNG, LNG' are both at an L level, signals Φ1', Φ2' are both fixed to an H level, and signal Φ3 rises to an H level in a pulse manner in synchronization with the rising edge of internal clock signal CLK' in cycle 3', as shown in FIGS. 21A to 21I. In response to the rising edge of external clock signal CLK in cycle 0, data DO read to data bus DB1 is transmitted to data buses DB2, DB3 without being adjusted in timing in latch circuits LA1, LA2, and also transmitted to output buffer 86 in synchronization with signal Φ3. Output buffer 86 outputs data DO to data input/output pin DQP in synchronization with the rising edge of external clock signal CLK in cycle 3.

In this embodiment as well, transfer gates may be connected in parallel with latch circuits LA1, LA2, as shown in FIG. 5, and two transfer gates may be rendered conductive while signals LNG, LNG' are at an L level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous type semiconductor memory device operating in synchronization with an external clock signal, comprising:

a memory array including a plurality of memory cells arranged in rows and columns;

a selection circuit for selecting a memory cell of said memory array in accordance with an address signal;

a read circuit for reading data of the memory cell selected by said selection circuit in synchronization with said external clock signal;

an internal clock generation circuit for producing an internal clock signal in synchronization with said external clock signal;

a transfer circuit activated in synchronization with said internal clock signal for receiving and transferring the data read by said read circuit;

an output circuit for externally outputting the data transferred by said transfer circuit; and a clock cycle detection circuit for detecting whether a cycle of said external clock signal or said internal clock signal is shorter than a predetermined cycle and, when it is shorter, activating said transfer circuit regardless of said internal clock signal.

2. The synchronous type semiconductor memory device according to claim 1, wherein said clock cycle detection circuit includes a delay circuit for delaying said external clock signal or said internal clock signal by predetermined time, a logic circuit for producing an OR signal of said external clock signal or said internal clock signal and an output signal from said delay circuit, a smoothing circuit for smoothing a potential of an output signal from said logic circuit, and a potential detection circuit for detecting whether an output potential of said smoothing circuit is higher or lower than a predetermined potential, outputting a signal at a first level when the output potential is higher, and outputting a signal at a second level when the output potential is lower; and said transfer circuit is activated regardless of said internal clock signal while said signal at a first level is output from said potential detection circuit, and activated in synchronization with said internal clock signal while said signal at a second level is output.

3. The synchronous type semiconductor memory device according to claim 1, wherein said clock cycle detection circuit includes a pulse generation circuit for producing a pulse signal having a predetermined pulse width in synchronization with said external clock signal or said internal clock signal, a first delay circuit for delaying the pulse signal produced in said pulse generation circuit by first predetermined time, a second delay circuit for delaying the pulse signal produced in said pulse generation circuit by second predetermined time that is longer than said first predetermined time, an erase circuit for erasing the pulse signal progressing in said second delay circuit in response to the pulse signal produced in said pulse generation circuit, a flip flop reset by an output pulse signal from said first delay circuit for outputting a signal at a first level, and set by an output pulse signal from said second delay circuit for outputting a signal at a second level, and a latch circuit for latching the output signal from said flip flop in response to the pulse signal produced in said pulse generation circuit; and said transfer circuit is activated regardless of said internal clock signal while said signal at the first level is latched in said latch circuit, and activated in synchronization with said internal clock signal while said signal at the second level is latched.

4. The synchronous type semiconductor memory device according to claim 1, further comprising a switch circuit connected in parallel with said transfer circuit, wherein said clock cycle detection circuit renders conductive said switch circuit when the cycle of said external clock signal or said internal clock signal is shorter than said predetermined cycle.

5. The synchronous type semiconductor memory device according to claim 1, further comprising a signal generation circuit for producing an activation signal delayed by first predetermined time from said external clock signal and having a first predetermined pulse width, wherein said read circuit outputs the data read in synchronization with said external clock signal in response to the activation signal produced in said signal generation circuit;

said clock cycle detection circuit includes a pulse generation circuit for producing a pulse signal having a second predetermined pulse width in synchronization with said internal clock signal, a delay circuit for delaying the activation signal produced in said signal generation circuit by second predetermined time, an erase circuit for erasing the activation signal progressing in said delay circuit in response to the pulse signal produced in said pulse generation circuit, and a flip flop set by the pulse signal produced in said pulse generation circuit for outputting a signal at a first level, and reset by the activation signal output from said delay circuit for outputting a signal at a second level; and said transfer circuit is activated by said signal at a first level from said flip flop, and inactivated by said signal at a second level.

6. A synchronous type semiconductor memory device operating in synchronization with an external clock signal, comprising:

a memory array including a plurality of memory cells arranged in rows and columns;

a selection circuit for selecting a memory cell of said memory array in accordance with an address signal;

a read circuit for reading data of the memory cell selected by said selection circuit in synchronization with said external clock signal;

an internal clock generation circuit for producing an internal clock signal in synchronization with said external clock signal;

first to Nth (N is an integer of at least 2) transfer circuits connected in series successively activated in synchronization with said internal clock signal, the transfer circuit at a first stage receiving the data read by said read circuit and each of the transfer circuits receiving data output from its previous stage and transferring data to its subsequent stage;

an output circuit for externally outputting the data transferred from said Nth transfer circuit; and a clock cycle detection circuit for detecting whether difference in time between predetermined transitions of said external clock signal and said internal clock signal is shorter than each of first to Nth predetermined cycles and, when it is shorter than an nth predetermined cycle (n is an integer from 1 to N, and the nth cycle is shorter than the (n+1) cycle), activating the first to the (N−n+1)th transfer circuits regardless of said internal clock signal.

7. The synchronous type semiconductor memory device according to claim 6, wherein said clock cycle detection circuit includes first and second pulse generation circuits for producing pulse signals having a predetermined pulse width in synchronization with said external clock signal and said internal clock signal, respectively, first to Nth delay circuits connected in series, the delay circuit at a first stage receiving the pulse signal produced in said first pulse generation circuit and each of the delay circuits delaying an output signal from its previous stage by at least first predetermined time and outputting the signal to its subsequent stage, an (N+1)th delay circuit for delaying the pulse signal produced in said second pulse generation circuit by second predetermined time, an erase circuit for erasing the pulse signal progressing in said first to Nth delay circuits in response to the pulse signal produced in said second pulse generation circuit, first to Nth flip flops each reset by an output pulse signal from said (N+1)th delay circuit for outputting a signal at a first level and set by output pulse signals from Nth to first delay circuits, respectively, each for outputting a signal at a second level, and first to Nth latch circuits for latching output signals from said first to Nth flip flops, respectively, in response to the pulse signal produced in said second pulse generation circuit, said first to Nth transfer circuits correspond to said first to Nth latch circuits, respectively, and each of said transfer circuits is activated regardless of said internal clock signal while said signal at a first level is latched in a corresponding one of said first to Nth latch circuits, and activated in synchronization with said internal clock signal while said signal at a second level is latched.

8. The synchronous type semiconductor memory device according to claim 6 further comprising first to Nth switch circuits connected in parallel with said first to Nth transfer circuits, respectively, wherein said clock cycle detection circuit renders conductive the first to (N−n+1)th switch circuits when the difference in time between predetermined transitions of said external clock signal and said internal clock signal is shorter than the nth predetermined cycle.

9. A synchronous type semiconductor memory device operating in synchronization with an external clock signal, comprising:

a memory array including a plurality of memory cells arranged in rows and columns;

a memory cell selection circuit for selecting a memory cell of said memory array in accordance with an address signal;

a first signal generation circuit for producing a first activation signal delayed by predetermined time from said external clock signal and having a first predetermined pulse width;

a read circuit for reading data of the memory cell selected by said memory cell selection circuit in synchronization with said external clock signal and outputting the data in response to said first activation signal;

an internal clock generation circuit for producing an internal clock signal in synchronization with said external clock signal;

a second signal generation circuit for producing a second activation signal having a second predetermined pulse width in synchronization with said internal clock signal;

a clock cycle detection circuit for detecting whether a cycle of said external clock signal or said internal clock signal is shorter or longer than predetermined cycle, outputting a signal at a first level when it is shorter, and outputting a signal at a second level when it is longer;

a signal selection circuit for selecting said first activation signal in response to said signal at a first level and selecting said second activation signal in response to said signal at a second level;

a transfer circuit activated by the first or second activation signal selected by said signal selection circuit for receiving and transferring the data read by said read circuit; and an output circuit for externally outputting the data transferred from said transfer circuit.

10. The synchronous type semiconductor memory device according to claim 9, wherein said clock cycle detection circuit includes a delay circuit for delaying said external clock signal or said internal clock signal by predetermined time, a logic circuit for producing an OR signal of said external clock signal or said internal clock signal and an output signal from said delay circuit, a smoothing circuit for smoothing a potential of the output signal from said logic circuit, and a potential detection circuit for detecting whether an output potential of said smoothing circuit is higher or lower than a predetermined potential, outputting a signal at a first level when it is higher, and outputting a signal at a second level when it is lower.

11. The synchronous type semiconductor memory device according to claim 9, wherein said clock cycle detection circuit includes a pulse generation circuit for producing a pulse signal having a predetermined pulse width in synchronization with said external clock signal or said internal clock signal, a first delay circuit for delaying the pulse signal produced in said pulse generation circuit by first predetermined time, a second delay circuit for delaying the pulse signal produced in said pulse generation circuit by second predetermined time that is longer than said first predetermined time, an erase circuit for erasing the pulse signal progressing in said second delay circuit in response to the pulse signal produced in said pulse generation circuit, a flip flop reset by an output pulse signal from said first delay circuit for outputting said signal at a first level, and set by an output pulse signal from said second delay circuit for outputting said signal at a second level, and a latch circuit for latching an output signal from said flip flop in response to the pulse signal produced in said pulse generation circuit and outputting the latched signal.

* * * * *